(12) United States Patent
Fukuta et al.

(10) Patent No.: US 8,841,870 B2
(45) Date of Patent: Sep. 23, 2014

(54) DRIVER FOR SWITCHING ELEMENT AND CONTROL SYSTEM FOR ROTARY MACHINE USING THE SAME

(71) Applicant: Denso Corporation, Kariya (JP)

(72) Inventors: Junichi Fukuta, Kuwana (JP); Tsuneo Maebara, Nagoya (JP)

(73) Assignee: Denso Corporation, Kariya (JP)

( * ) Notice: Subject to any disclaimer, the term of this patent is extended or adjusted under 35 U.S.C. 154(b) by 92 days.

(21) Appl. No.: 13/738,408

(22) Filed: Jan. 10, 2013

(65) Prior Publication Data

US 2013/0181640 A1 Jul. 18, 2013

(30) Foreign Application Priority Data

Jan. 12, 2012 (JP) ................................. 2012-003741

(51) Int. Cl.
*H02P 27/06* (2006.01)
*H03K 17/06* (2006.01)

(52) U.S. Cl.
USPC ............... 318/139; 318/400.22; 318/400.27; 318/400.3; 327/109; 327/419

(58) Field of Classification Search
USPC ................... 318/139, 400.22, 400.27, 400.3; 327/109, 419
See application file for complete search history.

(56) References Cited

U.S. PATENT DOCUMENTS

| 5,808,504 | A | 9/1998 | Chikai et al. |
| 8,058,937 | B2 * | 11/2011 | Qin et al. ...................... 331/111 |
| 2005/0077948 | A1 | 4/2005 | Kojima |
| 2008/0179112 | A1 * | 7/2008 | Qin et al. ................... 178/18.06 |
| 2008/0211847 | A1 * | 9/2008 | Shamoun ........................ 347/10 |

FOREIGN PATENT DOCUMENTS

| JP | 2001-346376 | 12/2001 |
| JP | 3339311 | 8/2002 |
| JP | 3373704 | 11/2002 |
| JP | 2010-283973 | 12/2010 |

OTHER PUBLICATIONS

Office Action (2 pages) dated Nov. 12, 2013, issued in corresponding Japanese Application No. 2012-003741 and English translation (2 pages).

* cited by examiner

*Primary Examiner* — Paul Ip
(74) *Attorney, Agent, or Firm* — Nixon & Vanderhye PC

(57) ABSTRACT

In a driver, a changing module changes a rate of discharging the control terminal of a switch at least between a first value and a second value lower than the first value. A measuring module measures a value of a parameter as a function of a current flowing through the conductive path of the switch during a drive signal being in an on state. A control module controls the changing module, as a function of the value of the parameter, to select the first value or the second value as the rate of discharging the control terminal of the switch upon the drive signal directing a change from the on state of the switch to an off state thereof. The control module discharges the control terminal of the switch using the selected value as the rate of discharging the control terminal of the switch.

18 Claims, 15 Drawing Sheets

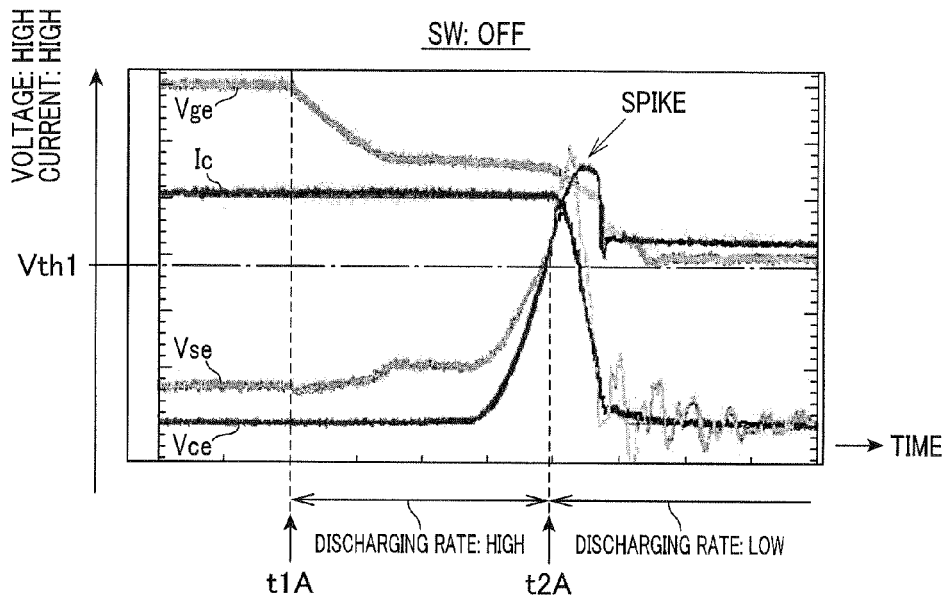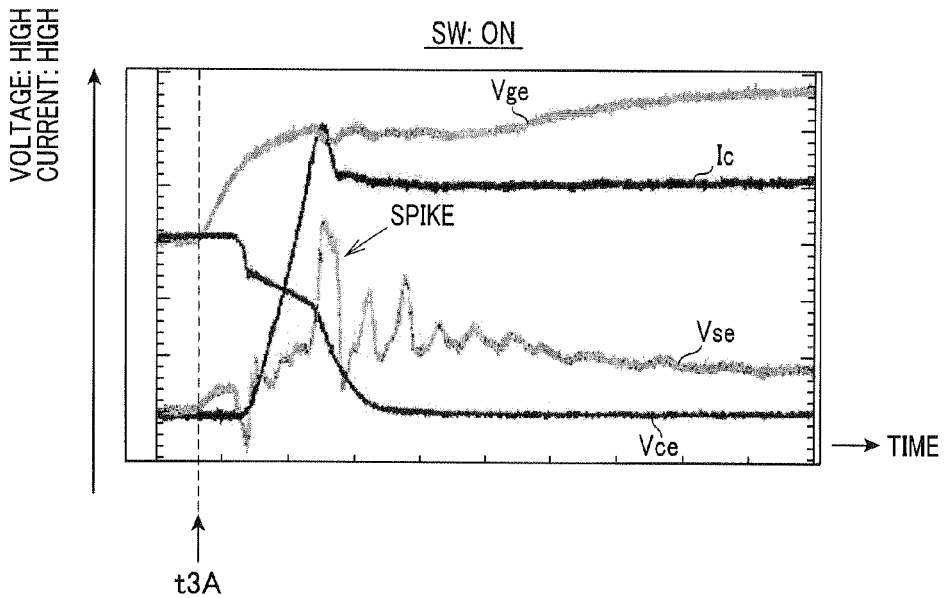

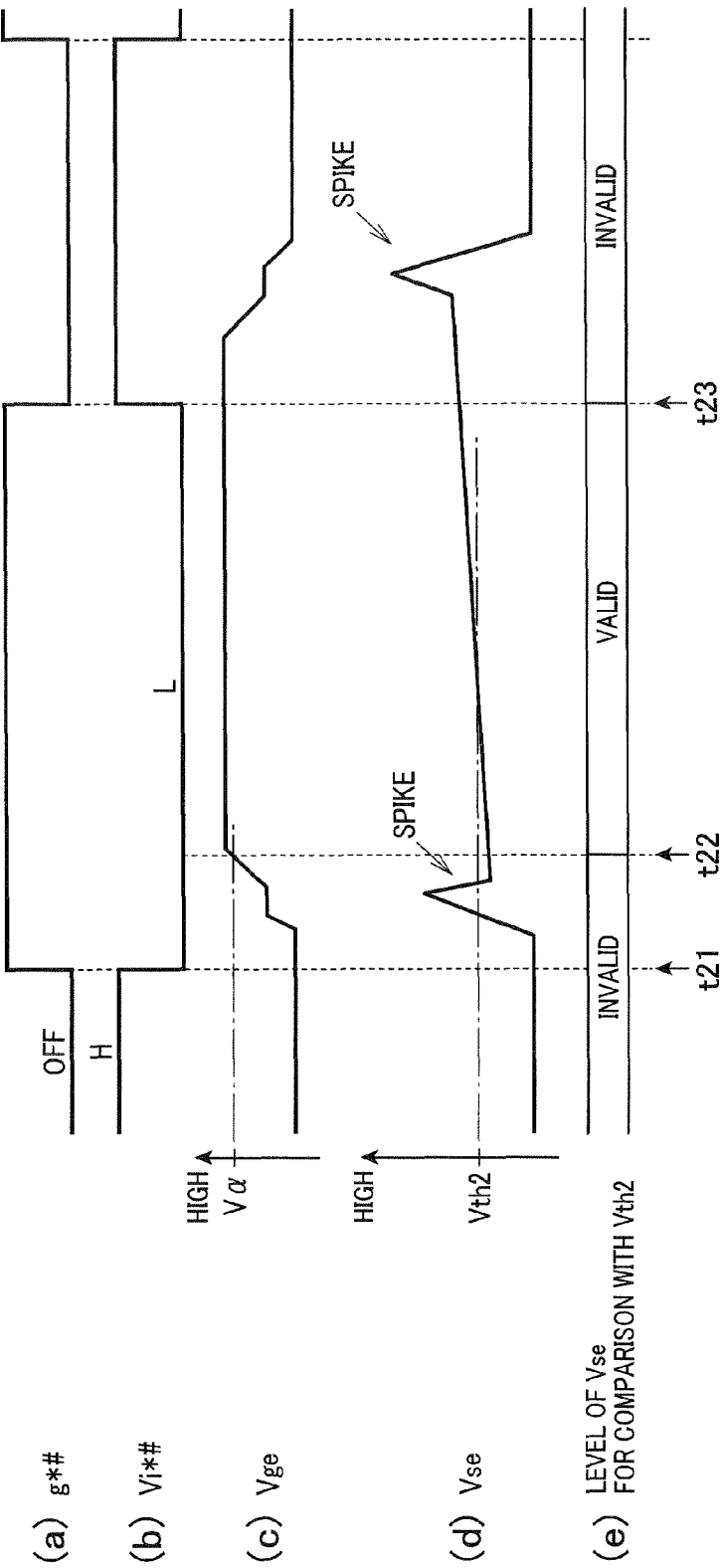

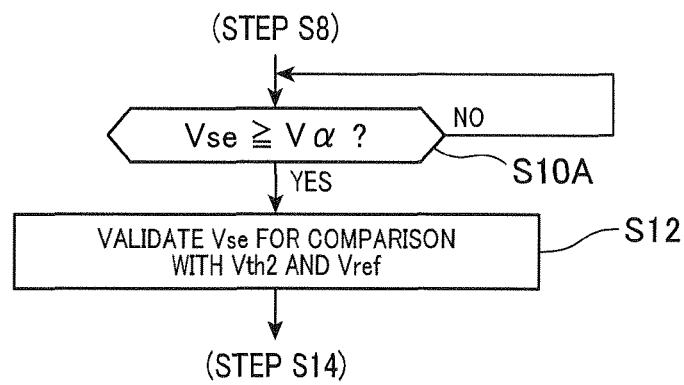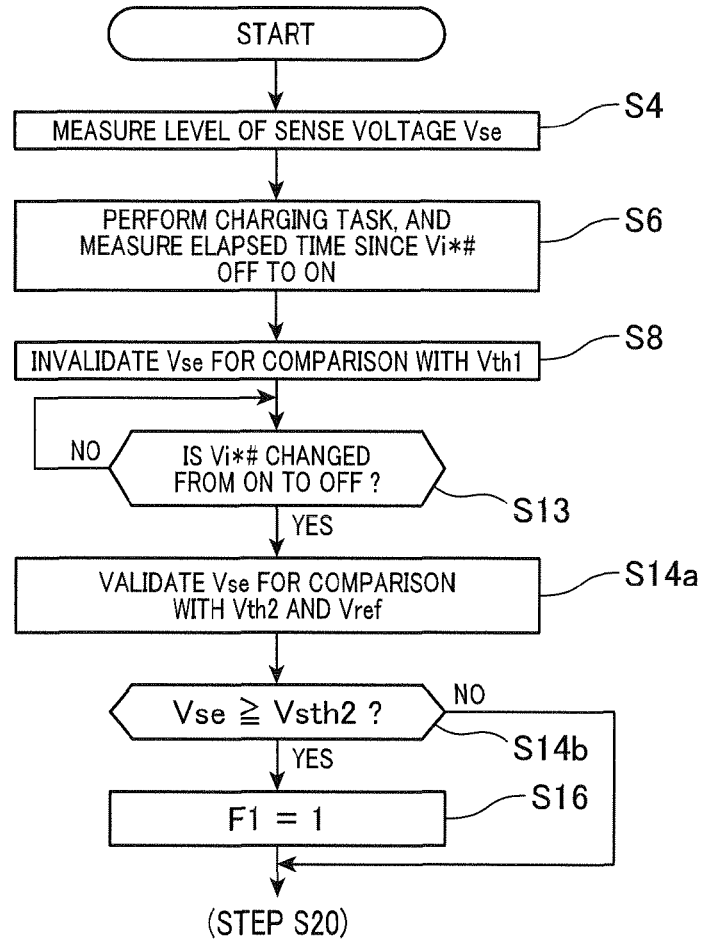

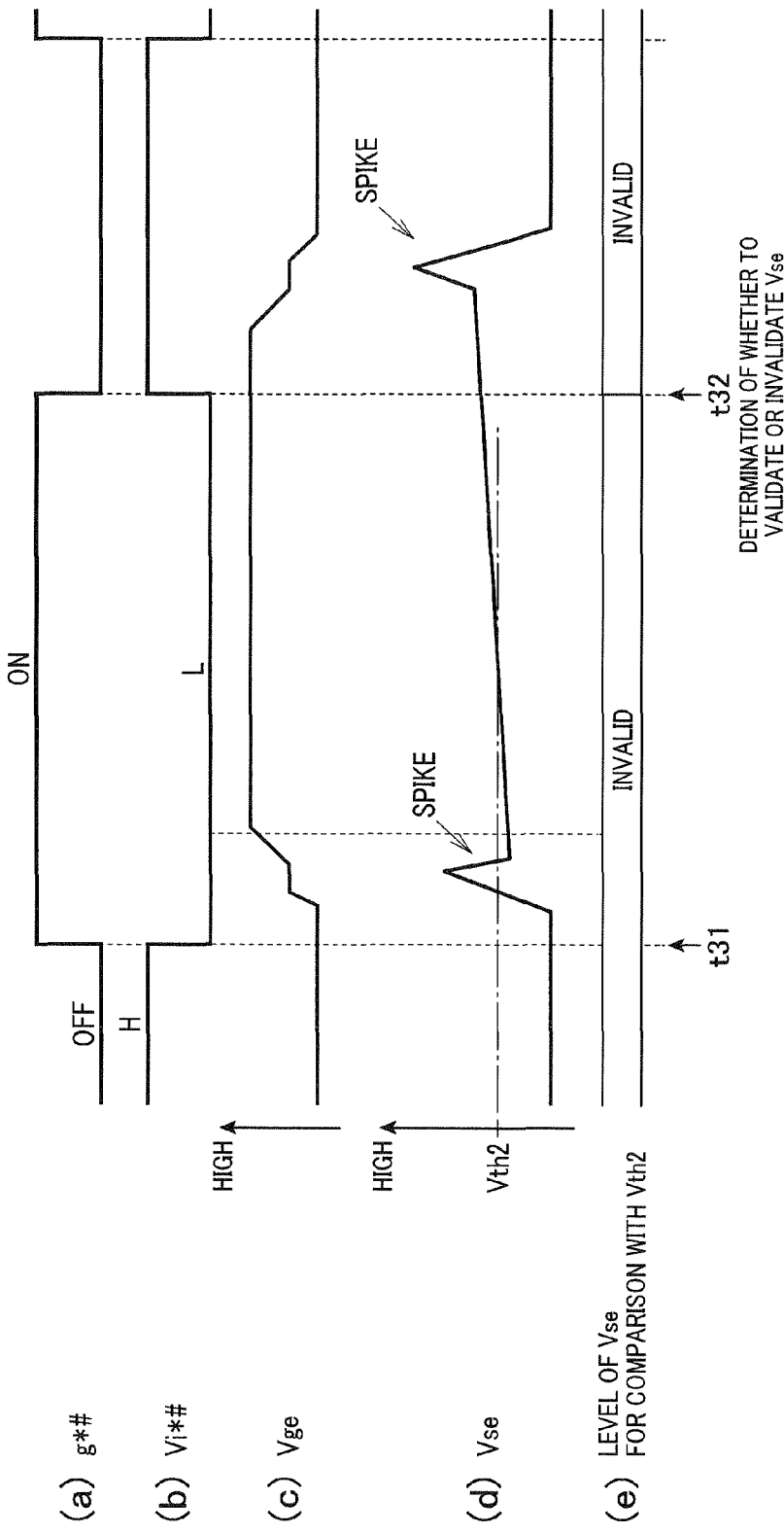

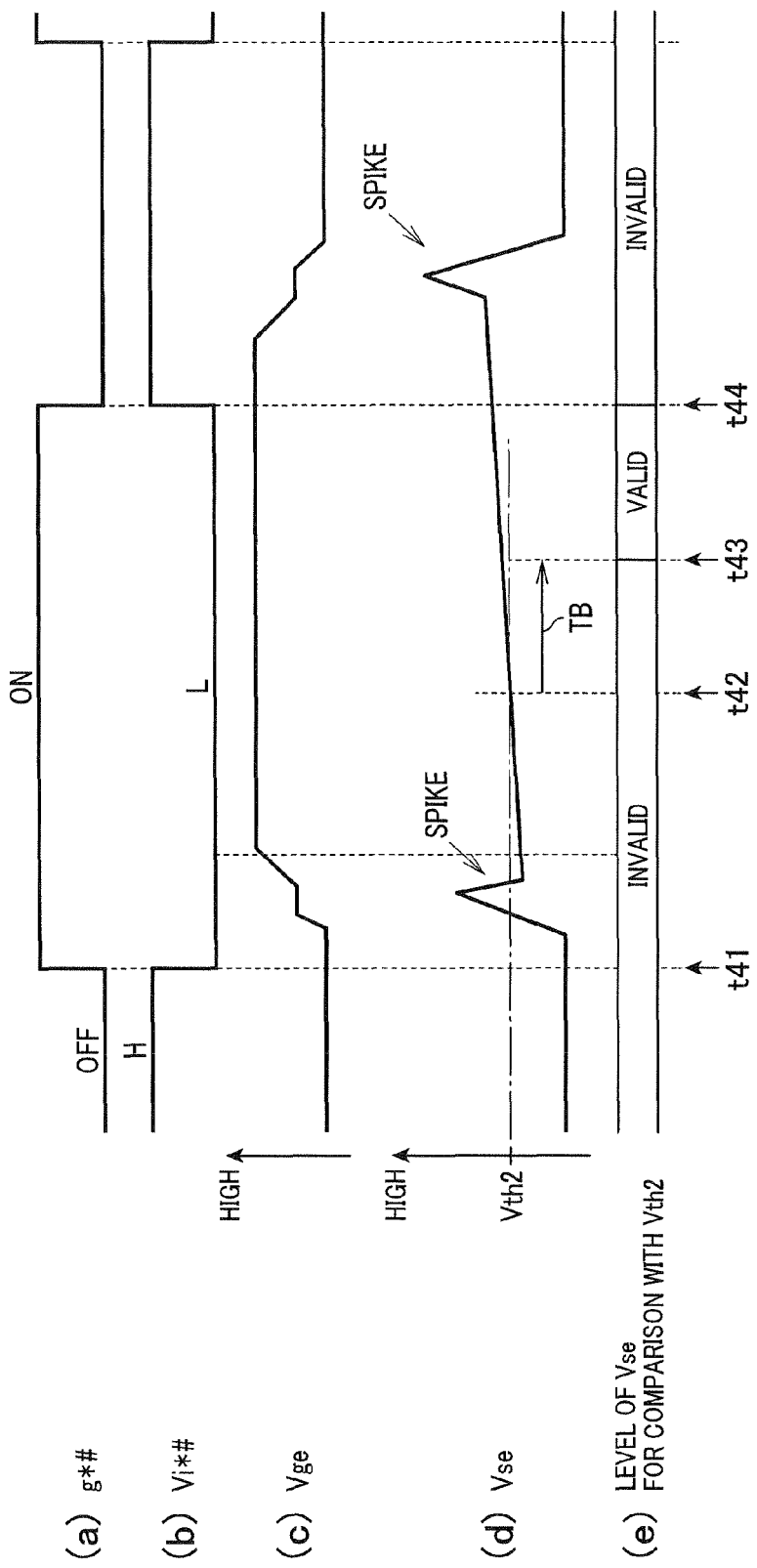

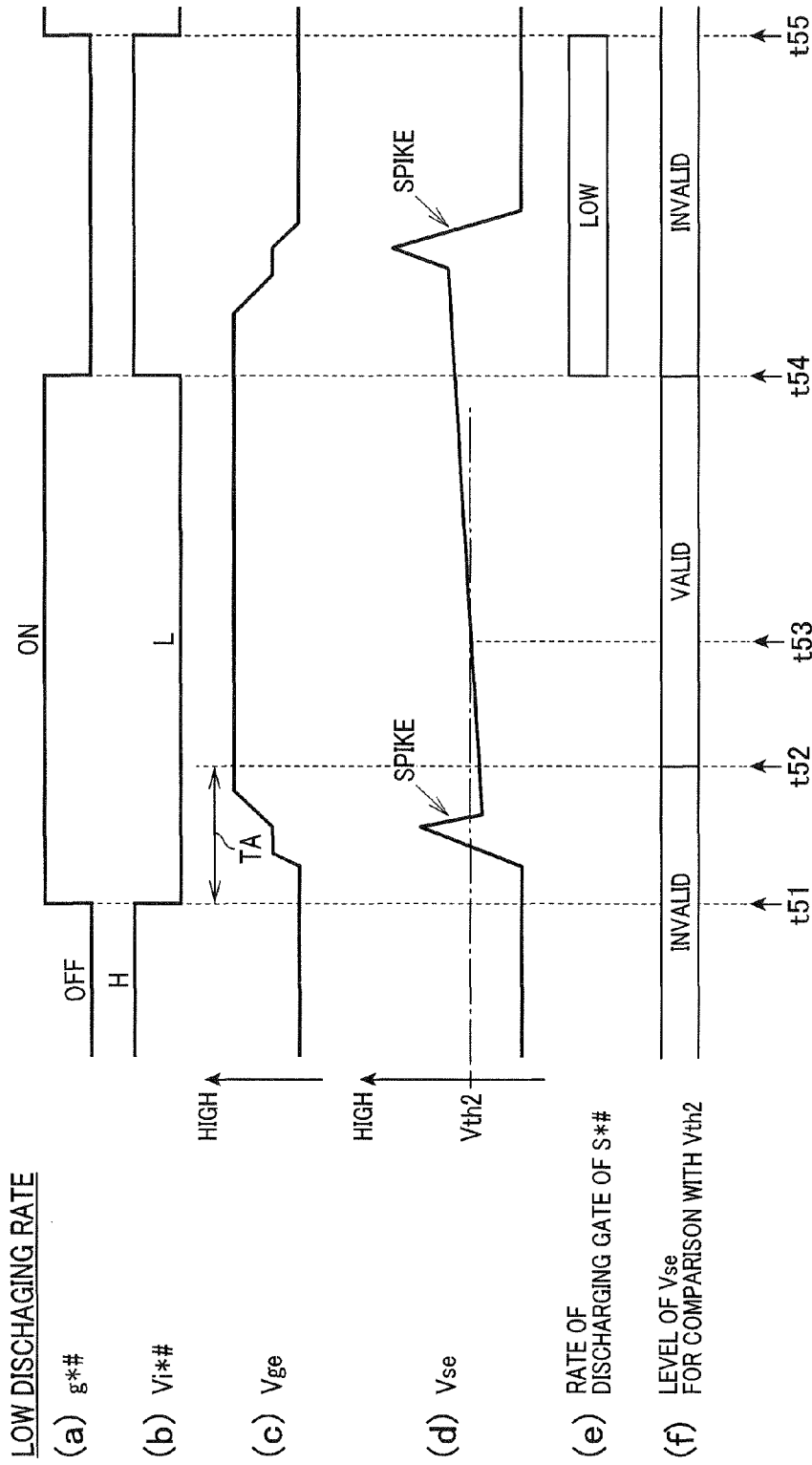

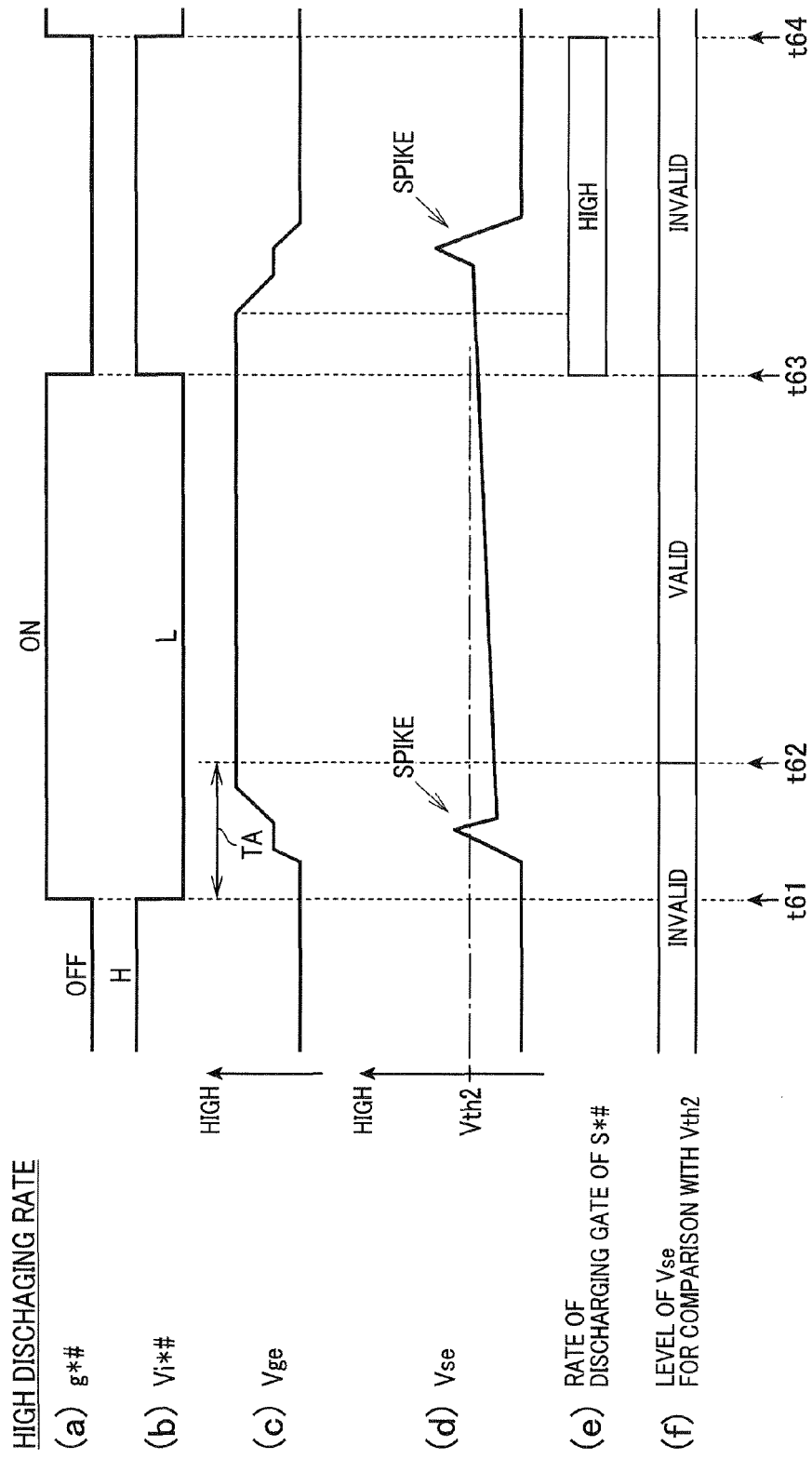

DRIVER FOR SWITCHING ELEMENT AND CONTROL SYSTEM FOR ROTARY MACHINE USING THE SAME

CROSS REFERENCE TO RELATED APPLICATIONS

This application is based on and claims the benefit of priority from Japanese Patent Application 2012-003741 filed on Jan. 12, 2012, the disclosure of which is incorporated in its entirety herein by reference.

TECHNICAL FIELD

The present disclosure relates to drivers for selectively storing and dissipating an electrical charge on and from the control terminals of voltage-controlled switching elements to selectively turn on and off the voltage-controlled switching elements. The present disclosure also relates to control systems for rotary machines using the drivers.

BACKGROUND

An example of active gate control for changing the rate of discharging the gate of an insulated-gate transistor, such as an IGBT (Insulated-Gate Bipolar Transistor), within a period from the start of dissipating charge stored in the gate to completion of the dissipation is known in, for example, Japanese Patent Publication No. 3373704, referred to as a first patent document. The known active gate control requires a differentiating circuit for outputting a signal indicative of a derivative value of a collector current flowing through an insulated-gate transistor. The known active gate control changes the discharge path connected to the gate of the insulated-gate transistor from a low-resistance discharge path to a high-resistance discharge path based on a result of comparison between the level of an output signal from the differentiating circuit and that of a reference signal. Specifically, the known active gate control is designed to increase the resistance of the discharge path connected to the gate of the insulated-gate transistor if the rate of reduction of the collector current is equal to or higher than a predetermined value. The known active gate control reduces an increase of a surge produced based on the rate of reduction of the collector current while reducing switching loss.

Another example of the active gate control is known in, for example, Japanese Patent Publication No. 3339311, referred to as a second patent document. The active gate control known in the second patent document provides a driver for a voltage-controlled switching element, such as an IGBT; the driver includes two discharge paths connected to the voltage-controlled switching element and having different resistance values. The active gate control known in the second patent document achieves the same effect as that known in the first patent document.

SUMMARY

Even if a surge is produced within a period during which an insulated-gate transistor is shifted from an on state to an off state, there may be a certain margin of voltage between an actually applied voltage across both ends, i.e. the collector and emitter, of a conductive path of the insulated-gate transistor and an acceptable upper limit therefor. In this case, if the timing to change the rate of discharging the gate of the insulated-gate transistor is uniformly determined based on the output signal from the differentiating circuit disclosed in the first patent document, it may be difficult to increase the switching speed of the insulated-gate transistor although there is room for increase in the switching speed using the margin. This may result in a decrease of the effect of reducing switching loss.

In view of the circumstances set forth above, one aspect of the present disclosure seeks to provide drivers for selectively storing and dissipating an electrical charge on and from the control terminals of voltage-controlled switching elements, which are designed to solve the problem set forth above.

Specifically, an alternative aspect of the present disclosure aims to provide such drivers, which are capable of sufficiently maintaining the effect of decreasing switching loss using active gate control. In other words, the alternative aspect of the present disclosure aims to provide such drivers, which are capable of preventing a decrease in the effect of reducing switching loss.

According to a first exemplary aspect of the present disclosure, there is provided a driver for selectively performing a charging task and a discharging task for an on-off control terminal of a voltage-controlled switch having a conductive path, according to a drive signal directing selectively an on state and an off state of the voltage-controlled switch, thus setting the voltage-controlled switch to one of the on state and the off state. The driver includes a discharging-rate changing module adapted to change a rate of discharging the on-off control terminal of the voltage-controlled switch at least between a first value and a second value lower than the first value. The driver includes a measuring module configured to measure a value of a parameter as a function of a current flowing through the conductive path of the voltage-controlled switch during the drive signal being in the on state. The driver includes a discharging control module configured to:

control the discharging-rate changing module, as a function of the value of the parameter, to select one of the first value and the second value as the rate of discharging the on-off control terminal of the voltage-controlled switch upon the drive signal directing a change from the on state of the voltage-controlled switch to the off state thereof; and discharge the on-off control terminal of the voltage-controlled switch using the selected one of the first value and the second value as the rate of discharging the on-off control terminal of the voltage-controlled switch.

A surge produced within the period during which the voltage-controlled switch is changed from the on state to the off state has a characteristic that, the higher the current flowing through the conductive path of the voltage-controlled switch is during the on state of the voltage-controlled switch, the higher the level of the surge is. This is because, the higher the current, referred to as a main current, flowing through the conductive path is when the voltage-controlled switching element is in the on state, the higher the rate of reduction of the main current is. Focusing on this characteristic, if the main current flowing through the voltage-controlled switching element is a lower value when the voltage-controlled switching element is in the on state, there is a certain margin of voltage between an actually applied voltage across the conductive path of the voltage-controlled switching element and an acceptable upper limit therefor within the period during which the voltage-controlled switch is changed from the on state to the off state.

In view of this point, the driver according to the first exemplary aspect of the present disclosure is configured to control the discharging-rate changing module, as a function of the value of the parameter correlating with the main current, to select one of the first value and the second value as the rate of discharging the on-off control terminal of the voltage-controlled switch upon the drive signal directing a change from the on state to the off state. That is, the driver according to the first exemplary aspect of the present disclosure adjusts the rate of discharging the on-off control terminal of the voltage-controlled switch according to the value of the parameter correlating with the main current so as to, for example, increase the switching speed of the voltage-controlled switch, making it possible to maintain, at a high level, the effect of decreasing switching loss thereof.

Note that discharging the gate of the voltage-controlled switching element means, for example, dissipating positive change from the gate of the voltage-controlled switching element, and storing negative charge on the gate of the voltage-controlled switching element.

According to a second exemplary aspect of the present disclosure, there is provided a control system for controlling a rotary machine. The control system includes a converter equipped with at least one pair of first voltage-controlled switching elements connected in series, each of the first voltage-controlled switching elements having a conductive path and an on-off control terminal. The converter includes an inverter equipped with at least one pair of second voltage-controlled switching elements connected in series, each of the second voltage-controlled switching elements having a conductive path and an on-off control terminal. The converter includes a driver for selectively performing a charging task and a discharging task for the on-off control terminal of each of the voltage-controlled switching elements, according to a drive signal directing selectively an on state and an off state of the voltage-controlled switch to thereby boost a DC voltage inputted to the converter, and invert the boosted DC voltage into an AC voltage to be supplied to the rotary machine. The driver for each of the first and second voltage-controlled switching elements includes a discharging-rate changing module adapted to change a rate of discharging the on-off control terminal of a corresponding one of the first and second voltage-controlled switching elements at least between a first value and a second value lower than the first value. The driver for each of the first and second voltage-controlled switching elements includes a measuring module configured to measure a value of a parameter as a function of a current flowing through the conductive path of a corresponding one of the first and second voltage-controlled switching elements during the drive signal being in the on state. The driver includes a discharging control module configured to:

control the discharging-rate changing module, as a function of the value of the parameter, to select one of the first value and the second value as the rate of discharging the on-off control terminal of a corresponding one of the first and second voltage-controlled switching elements upon the drive signal directing a change from the on state of a corresponding one of the first and second voltage-controlled switching elements to the off state thereof; and discharge the on-off control terminal of a corresponding one of the first and second voltage-controlled switching elements using the selected one of the first value and the second value as the rate of discharging the on-off control terminal thereof.

The converter and the inverter of the control system according to the second exemplary aspect of the present disclosure include a driver according to the first exemplary aspect of the present disclosure for each of the first and second voltage-controlled switching elements. For this reason, the control system achieves the same technical effect as the driver according to the first exemplary aspect of the present disclosure does.

The above and/or other features, and/or advantages of various aspects of the present disclosure will be further appreciated in view of the following description in conjunction with the accompanying drawings. Various aspects of the present disclosure can include and/or exclude different features, and/or advantages where applicable. In addition, various aspects of the present disclosure can combine one or more feature of other embodiments where applicable. The descriptions of features, and/or advantages of particular embodiments should not be construed as limiting other embodiments or the claims.

BRIEF DESCRIPTION OF THE DRAWINGS

Other aspects of the present disclosure will become apparent from the following description of embodiments with reference to the accompanying drawings in which:

FIG. 3 is a graph schematically illustrating measurement results of how a gate voltage, a collector-emitter voltage, a sense voltage, and a collector current vary after the start of discharging the gate of a switching element due to the turnoff of the switching element;

FIG. 4 is a graph schematically illustrating measurement results of how the gate voltage, the collector-emitter voltage, the sense voltage, and the collector current vary after the start of charging the gate of a switching element due to the turn-on of the switching element;

FIG. 9A is a timing chart schematically illustrating an example of specific operations of variables correlated with a charging and discharging routine using active gate control according to a second embodiment of the present disclosure;

FIG. 9B is a flowchart schematically illustrating an example of a part of the charging and discharging routine according to the second embodiment;

FIG. 10A is a timing chart schematically illustrating an example of specific operations of variables correlated with a charging and discharging routine using active gate control according to a third embodiment of the present disclosure;

FIG. 10B is a flowchart schematically illustrating an example of a part of the charging and discharging routine according to the third embodiment;

FIG. 11A is a timing chart schematically illustrating an example of specific operations of variables correlated with a charging and discharging routine using active gate control according to a fourth embodiment of the present disclosure;

FIG. 12 is a timing chart schematically illustrating an example of specific operations of variables correlated with a charging and discharging routine using active gate control according to a fifth embodiment of the present disclosure;

FIG. 13 is a timing chart schematically illustrating an example of specific operations of the variables correlated with the charging and discharging routine while the active gate control is not used according to the fifth embodiment.

DETAILED DESCRIPTION OF EMBODIMENT

Figure 1:
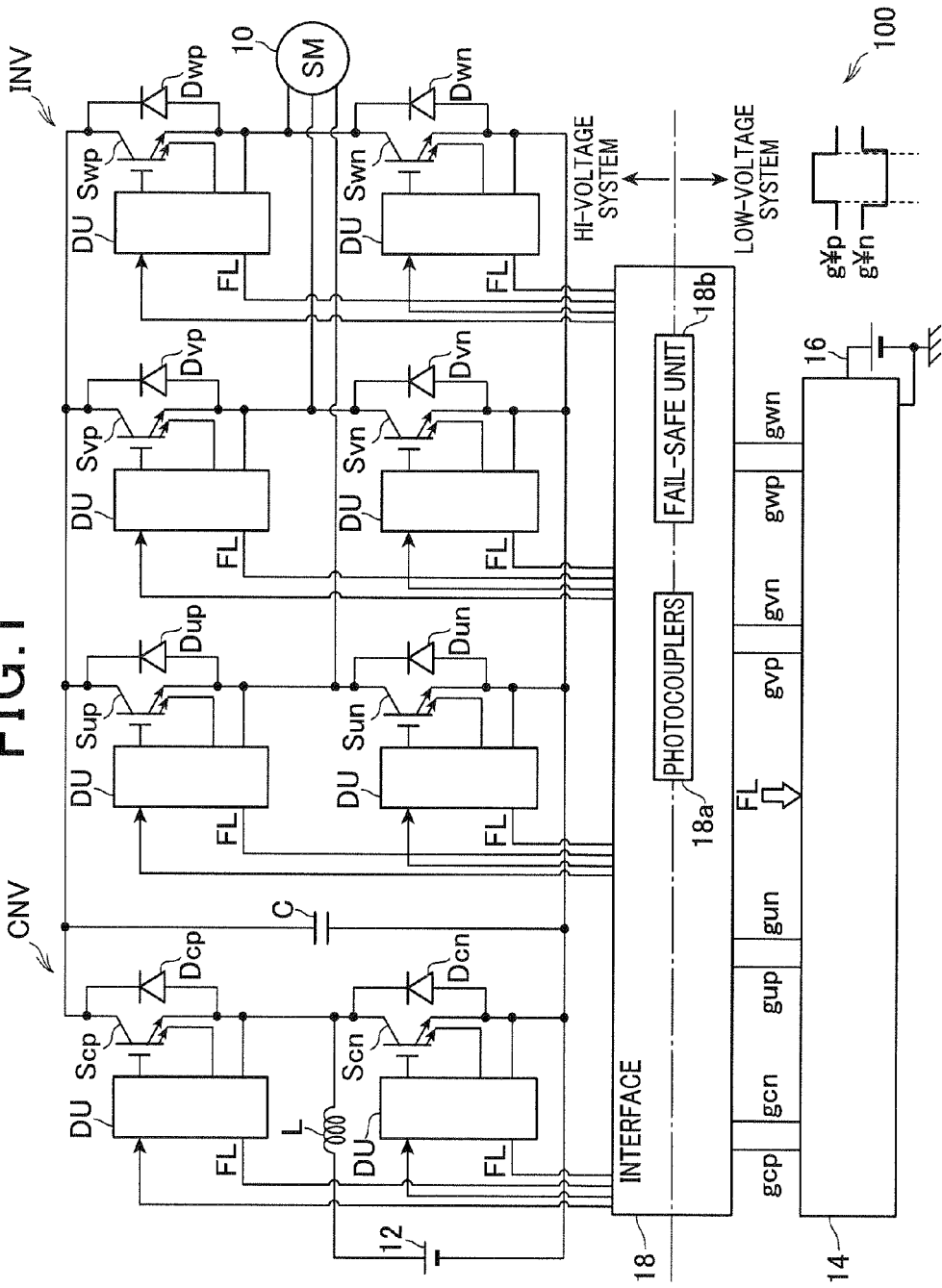
FIG. 1 is a view schematically illustrating an overall configuration of a control system for a motor-generator according to a first embodiment of the present disclosure.

Embodiments of the present disclosure will be described hereinafter with reference to the accompanying drawings. In the embodiments, like parts between the embodiments, to which like reference characters are assigned, are omitted or simplified to avoid redundant description.

First Embodiment

Referring to FIG. 1, there is illustrated a three-phase motor-generator as an example of rotating machines, referred to simply as a "motor-generator" 10, installed in, for example, a motor vehicle as a main engine according to the first embodiment. The motor-generator 10 is mechanically coupled to driving wheels (not shown) of the motor vehicle.

For example, as the motor-generator 10, a brush-less DC motor, i.e. a three-phase SM (Synchronous Motor), is used.

The motor-generator 10 is made up of, for example, a rotor including a magnetic field and a stator including three-phase windings, i.e. U-, V-, and W-phase windings. The rotor of the motor-generator 10 is rotated based on magnetic interaction between the magnetic field of the rotor and a rotating field generated by the three-phase windings when the three-phase windings are energized. For example, the three-phase windings (U-, V-, and W-phase windings) each have one end connected to a common junction (neutral point) and the other end to a separate terminal in, for example, a star-configuration.

In FIG. 1, there is also illustrated a control system 100 for controlling the motor-generator 10. The control system 100 is equipped with an inverter INV, a converter CNV, a high-voltage battery 12 as an example of DC power sources, drive units, i.e. drivers, DU, a control unit 14, a low-voltage battery 16, and an interface 18.

To the motor-generator 10, the high-voltage battery 12 is electrically connected via the inverter INV and the converter CNV. The high-voltage battery 12 has a terminal voltage of, for example, 288 V thereacross.

The converter CNV includes a capacitor C, a pair of series-connected switches, in other words, switching elements Scp and Scn, a pair of flywheel diodes Dcp and Dcn, and a reactor L. The capacitor C is connected in parallel to the inverter INV, and the series-connected switching elements Scp and Scn are connected in parallel to the capacitor C. The flywheel diodes Dcp and Dcn are connected in antiparallel to the corresponding switching elements Scp and Scn, respectively. One end of the reactor L is connected to both the positive terminal of the high-voltage battery 12 and the connection point between the switching elements Scp and Scn. One end of the series-connected switching elements Scp and Scn of the converter CNV is connected to the positive DC input line of the inverter INV, and the other end thereof is connected to the negative DC input line of the inverter INV. The negative DC input line of the inverter INV is connected to the negative terminal of the battery 12.

The converter CNV is operative to convert the terminal voltage of the high-voltage battery 12 into a voltage higher than the terminal voltage of the high-voltage battery 12, and output the boosted voltage as an output DC voltage thereof across the capacitor C. The predetermined upper limit of the step-up of the terminal voltage by the converter CNV is set to a predetermined high voltage, such as 666 V.

The inverter INV is designed as a three-phase inverter. The inverter INV is provided with three pairs of series-connected high- and low-side (upper- and lower-arm) switches, in other words, switching elements Sup and Sun, Svp and Svn, and Swp and Swn. The inverter INV is also provided with flywheel diodes D*# (*=u, v, w, #=p, n) electrically connected in antiparallel to the corresponding switching elements S*# (*=u, v, w, #=p, n), respectively.

In the first embodiment, as the switching elements S*# (*=u, v, w, #=p, n), IGBTs are respectively used.

When power MOSFETs are used as the switching elements S*# (*=u, v, w, #=p, n), intrinsic diodes of the power MOSFETs can be used as the flywheel diodes, thus eliminating the flywheel diodes.

The three pairs of switching elements are parallelly connected to each other in bridge configuration. A connecting point through which each of the switching elements S*p (*=u, v, w) is connected to a corresponding one of the S*n (*=u, v, w) in series is connected to an output lead extending from the separate terminal of a corresponding one of the U-phase winding, V-phase winding, and W-phase winding. One end of the series-connected switching elements of each of the three pairs, such as the collector of the corresponding high-side switching element, is connected to the positive terminal of the high-voltage battery 12 via the positive DC input line. The other end of the series-connected switching elements of each of the three pairs, such as the emitter of the corresponding low-side switching element, is connected to the negative terminal of the high-voltage battery 12 via the negative DC input line.

For example, the control unit 14 operates on a power-supply voltage, lower than the terminal voltage across the high-voltage battery 12, supplied from the low-voltage battery 16. Thus, the control unit 14 and the low-voltage battery 16 constitute a low voltage system. In contrast, the motor-generator 10, the converter CNV, the inverter INV, and the high-voltage battery 12 constitute a high voltage system.

The interface 18 is provided with insulation members, such as photocouplers 18a provided for the respective switching elements S*# of the inverter INV and converter CNV. Each of the photocouplers 18a is comprised of a photodiode and a phototransistor. The photocouplers 18a are configured to enable communications between the high and low voltage systems while establishing electrical insulation therebetween. Specifically, each of the photocouplers 18a is configured to enable the control unit 14 to control a corresponding one of the switching elements S*# while establishing electrical insulation between the control unit 14 and a corresponding one of the switching elements S*#.

The control unit 14 is designed to individually drive the inverter INV and the converter CNV to thereby control a controlled variable of the motor-generator 10, such as an output torque of the motor-generator 10.

Specifically, the control unit 14 is designed to individually send drive signals gcp and gcn to the drive units DU provided for the respective switching elements Scp and Scn, thus individually turning on or off the respective switching elements Scp and Scn. The control unit 14 is also designed to individually send drive signals gup, gun, gyp, gvn, gwp, and gwn to the drive units DU provided for the respective switching elements Sup, Sun, Svp, Svn, Swp, and Swn, thus individually turning on or off the respective switching elements Sup, Sun, Svp, Svn, Swp, and Swn. The individual turn-on or off of the respective switching elements Sup, Sun, Svp, Svn, Swp, and Swn convert the output DC voltage across the capacitor C into an AC voltage, and supply the AC voltage to the motor-generator 10.

Each of the drive signals g*# has a predetermined duty cycle, i.e. a predetermined ratio of on duration to the total duration of each switching cycle for a corresponding one of the switching elements S*# (see FIG. 1).

Specifically, the control unit 14 is designed to complementarily turn on the high- and low-side switching elements S*# for each leg (phase) via the corresponding drive units DU according to the corresponding drive signals g*#. In other words, the control unit 14 is designed to alternately turn on the high-side switching element S*p of one leg (phase) and the low-side switching element S*n of the same leg (phase). This drive alternately closes the conductive path between the collector and emitter of the high-side switching element S*p of one leg and the conductive path between the collector and emitter of the high-side switching element S*n of the same leg.

Next, an example of the circuit structure of each drive unit DU provided for a corresponding one switching element S*# will be described with reference to FIG. 2.

Figure 2:
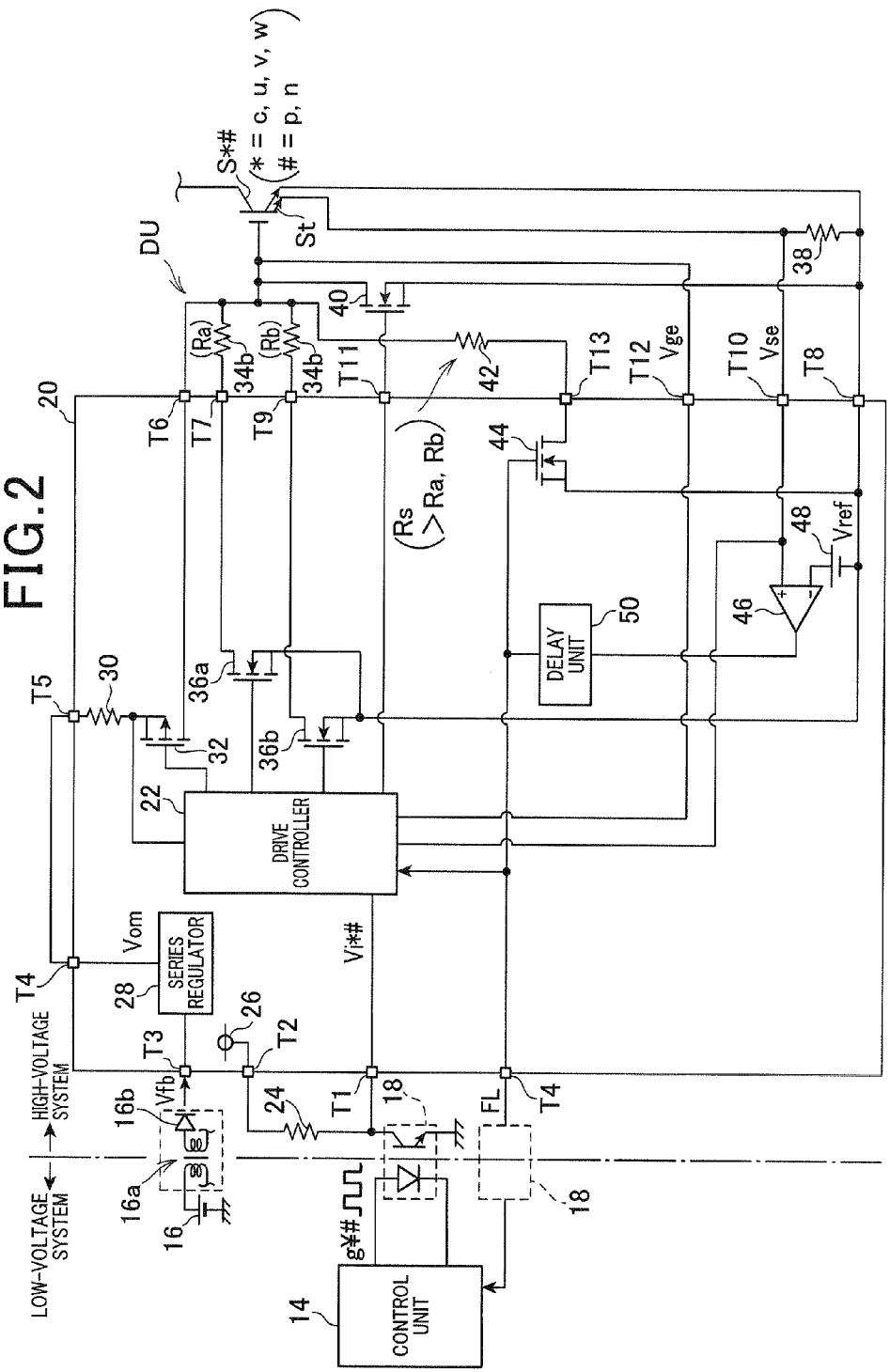
FIG. 2 is a circuit diagram schematically illustrating each drive unit of the control system illustrated in FIG. 1.

Referring to FIG. 2, the drive unit DU is comprised of a drive IC 20 on a chip, resistors 24, 34a, 34b, 38, and 42, and an off-state holding switching element 40.

The drive IC 20 has terminals T1 to T13, a drive controller 22, a power source 26, a series regulator 28, a resistor 30, a charge switching element 32, a first discharge switching element 36a, a second discharge switching element 36b, and a soft-turnoff switching element 44. The drive IC 20 also has a comparator 46, a reference power source 48, and a delay unit 50. As the charging switching element 32, a P-channel MOSFET is used, and as each of the switching elements 36a, 36b, 40, and 44, an N-channel MOSFET is used.

An output terminal of the power source 26 is connected to the drive controller 22 via the terminal T2, the resistor 24, i.e. the pull-up resistor 24, and the terminal T1. The power source 26 has, for example, a terminal voltage of 5 V. To the terminal T1, the secondary side, i.e. the collector of the phototransistor, of the photocoupler 18a is connected. The emitter of the phototransistor of the photocoupler 18a is grounded. The primary side of the photocoupler 18a, i.e. the photodiode, is connected to the control unit 14.

That is, the phototransistor of the photocoupler 18a of each switching element S*# is OFF if a drive signal g*# with a low level outputted from the control unit 14 is inputted to the photocoupler 18a. This causes the resistor 24 to pull up the potential of the terminal T1 of the drive IC 20 to the terminal voltage of the power source 26. Otherwise, if a drive signal g*# with a high level outputted from the control unit 14 is inputted to the photocoupler 18a, the phototransistor of the photocoupler 18a of each switching element S*# is ON. This causes the terminal T1 of the drive IC 20 to be grounded via the phototransistor of the photocoupler 18a.

That is, if the photocoupler 18a is OFF, the drive signal Vi*# with a high voltage level is inputted to the drive controller 22 via the terminal T1, and otherwise if the photocoupler 18a is ON, the drive signal Vi*# with a low voltage level is inputted to the drive controller 22 via the terminal T1. If the drive signal Vi*# directs the high level, i.e. ON, the drive controller 22 is configured to carry out a discharging task for the on-off control terminal, i.e. gate, of a corresponding switching element S*# described later. Otherwise, if the drive signal Vi*# directs the low level, i.e. OFF, the drive controller 22 is configured to carry out a charging task for the gate of a corresponding switching element S*# described later. Note that the drive signal Vi*# with the high level will be referred to as an off command, and the drive signal Vi*# with the low level will be referred to as an on command.

In addition, note that the drive signal g*p and the drive signal Vi*p for the high-side switching element S*p of each leg (phase) and the drive signal g*n and the drive signal Vi*n for the low-side switching element S*n of a corresponding one leg (phase) are complementary signals therebetween. In other words, the high-side switching element S*p of one leg and the low-side switching element S*n of the same leg are complementarily turned on.

To the terminal T3 of the drive IC 20, a voltage Vfb of a power source for the drive unit DU is applied. For example, as the power source, a flyback converter 46 installed in, for example, the interface 14 can be used. The flyback converter 46 is comprised of a transformer 46a and a diode 46b; the transformer 46a includes a primary winding and a secondary winding. Magnetic energy charged in the primary winding based on the voltage across the low-voltage battery 16 induces a voltage across the secondary winding, and power based on the voltage induced across the secondary winding is supplied via the diode 46b and the terminal T3 of the drive IC 20 to the series regulator 28.

The series regulator 28 is operative to step down the voltage Vfb supplied from the flyback converter 46 to a voltage Vom to be applied to the gate of the switching element S*#.

An output terminal of the series regulator 28 is connected to one end of the resistor 30 via the terminals T4 and T5 of the drive IC 20. The other end of the resistor 30 is connected to the source of the charge switching element 32 in series, and the drain of the charge switching element 32 is connected to the gate of the switching element S*# via the terminal T6 of the drive IC 20. The gate of the charge switching element 32 is connected to the drive controller 22.

The gate of the switching element S*# is also connected to the terminal T7 of the drive IC 20 via the resistor 34a. The drain of the first discharge switching element 36a is connected to the terminal T7, and the source thereof is connected to the emitter of the switching element S*# via a common potential line of the drive unit DU and the terminal T8 of the drive IC 20.

The gate of the first discharge switching element 36a is connected to the drive controller 22. The gate of the switching element S*# is further connected to the terminal T9 of the drive IC 20 via the resistor 34b. The drain of the second discharge switching element 36b is connected to the terminal T9, and the source thereof is connected to the emitter of the switching element S*# via the common potential line of the drive unit DU and the terminal T8 of the drive IC 20. The gate of the second discharge switching element 36b is connected to the drive controller 22.

That is, a first positive-charge dissipating path, in other words, a first negative-charge storing path is provided between the gate of the switching element S*# and the common potential line via the resistor 34a, the terminal T7, the first discharge switching element 36a, and the terminal T8. Similarly, a second positive-charge dissipating path, in other words, a second negative-charge storing path is provided between the gate of the switching element S*# and the common potential line via the resistor 34b, the terminal T9, the second discharge switching element 36b and the terminal T8.

Each of the resistors 34a and 34b is a linear element. The resistors 34a and 34b have respective resistances, i.e. gate resistances, Ra and Rb; the resistance Ra of the resistor 34a can be set to be equal to or different from the resistance Rb of the resistor 34b. If the resistances Ra and Rb are different from each other, the difference therebetween results in the difference in resistance between the first and second negative-charge storing paths. Selecting one of the first and second negative-charge storing paths enables active gate control for the switching element S*#.

The switching element S*# has a sense terminal St for outputting a minute current positively associated with a current, such as a collector current, flowing through the conductive path between the collector and emitter thereof. The sense terminal St is connected to both the common potential line of the drive unit DU via the resistor 38 and the drive controller 22 via the terminal T10.

When a collector current flows through the conductive path of the switching element S*#, a minute current positively correlated with the collector current flows through the resistor 38, so that a voltage drop across the resistor 38 occurs. The drive controller 22 measures the voltage drop across the resistor 38 as a sense voltage Vse at one end of the resistor 38 connected to the sense terminal St. This measurement obtains, as the measured level of the sense voltage Vse, an electric state quantity of the magnitude of the collector current flowing through the switching element S*#; the electric state quantity is positively correlated with the magnitude of the collector current. That is, the level of the sense voltage Vse is as a function of, i.e. correlates with, the magnitude of the collector current flowing through the switching element S*#.

In addition, the gate of the switching element S*# is connected to the drain of the off-state holding switching element 40, the source of which is connected to the common potential line of the drive unit DU. The off-state holding switching element 40 is adapted to short-circuit the electrical path between the gate and source of the switching element S*#. In order to reduce the resistance of the gate and source of the switching element S*# as low as possible, the off-state holding switching element 40 is located as close as possible to the switching element S*#. The impedance of an electrical path including the off-state holding switching element 40 between the gate and source of the switching element S*# is set to be lower than that of each of the first and second positive-charge dissipating paths, i.e. the normal discharge paths. The electrical path including the off-state holding switching element 40 will be referred to as a short-circuit path hereinafter. This setting aims to prevent the switching element S*# from erroneously being ON due to high-frequency noise superimposition on the gate thereof through the medium of parasitic capacitance between first and second ends, i.e. the emitter and collector, of the conductive path of the switching element S*# during the OFF state of the switching element S*#.

The gate of the off-state holding switching element 40 is connected to the drive controller 22 via the terminal T11 of the drive IC 20. The gate of the switching element S*# is connected directly to the drive controller 22 via the terminal T12 of the drive IC 20. An electrical path between the gate of the switching element S*# and the drive controller 22 via the terminal T12 serves as a gate-voltage monitor line for monitoring a voltage difference between the first end (emitter) of the conductive path of the switching element S*# and the gate thereof as a level of gate voltage, i.e. gate-emitter voltage, Vge.

That is, the drive controller 22 is operative to monitor the level of the gate voltage Vge through the gate-voltage monitor line, and determine whether the monitored level of the gate voltage Vge is in agreement with an OFF start voltage Vgth. The drive controller 22 is operative to turn on or off the off-state holding switching element 40 using a result of the determination and the drive signal V*#.

Specifically, during the on duration of the drive signal Vi*# to charge the gate of the switching element S*# or during the off duration of the drive signal V*# to discharge the gate of the switching element S*# with the monitored level of the gate voltage Vge being higher than the OFF start voltage Vgth, the drive controller 22 turns off the off-state holding switching element 40. On the other hand, during the off duration of the drive signal V*# to discharge the gate of the switching element S*# with the monitored level of the gate voltage Vge being equal to or lower than the OFF start voltage Vgth, the drive controller 22 turns on the off-state holding switching element 40.

The ON state of the off-state holding switching element 40 short-circuits the gate and emitter of the switching element S*# to thereby holding the OFF state of the switching element S*#. For example, the OFF start voltage Vgth can be set to be lower than a mirror voltage of the switching element S*# described later.

On the other hand, the gate of the switching element S*# is connected to the terminal T13 of the drive IC 20 via the resistor 42. The terminal T13 is connected to the drain of the soft-turnoff switching element 44, and the source thereof is connected to the common potential line of the drive unit DU. The resistance Rs of the resistor 42 is set to be higher than the resistance values Ra and Rb of the resistors 34a and 34b. This setting aims to increase the resistance of an electrical path including the soft-turnoff switching element 44 between the gate of the switching element S*# and the common potential line of the drive IC 20 to be higher than that of each of the first and second positive-charge dissipating paths. The electrical path including the soft-turnoff switching element 44 will be referred to as a high-resistance discharge path hereinafter.

The comparator 46 has a non-inverting input terminal, an inverting input terminal, and an output terminal. The non-inverting input terminal of the comparator 46 is connected to the terminal T10, so that the sense voltage Vse is also inputted to the non-inverting input terminal of the comparator 46 via the terminal T10. The inverting input terminal of the comparator 46 is connected to a positive terminal of the reference power source 48, and a negative terminal of the reference power source 48 is connected to the common potential line of the drive unit DU. A reference voltage Vref outputted from the reference power source 48 is applied to the inverting input terminal of the comparator 46.

A level of the reference voltage Vref is set to match the level of the sense voltage Vse while the magnitude of the collector current flowing through the switching element S*# becomes equal to or higher than a threshold value. This setting of the reference voltage Vref causes an output signal of the comparator 46 to be turned from a low level, i.e. a logical OFF value, to a high level, i.e. a logical ON value, when the magnitude of the collector current becomes equal to or higher than the threshold value. In other words, the comparator 46 is designed to output the signal with the low level while the magnitude of the collector current is lower than the threshold value, and output the signal with the high level while the magnitude of the collector current is equal to or higher than the threshold value.

The delay unit 50 is configured to capture the output signal from the comparator 46, and a fail-safe signal FL as long as the captured output signal from the comparator 46 is being the high level during a predetermined period. In other words, when the output signal of the comparator 46 is turned from the low level to the high level, the delay unit 50 outputs the fail-safe signal FL after the predetermined period has elapsed since the change of the output signal of the comparator 46 from the low level to the high level. The fail-safe signal FL is sent to the low-voltage system via the terminal T4, and to the gate of the soft-turnoff switching element 44. The fail-safe signal FL represents an abnormal state in the operation of the switching element SY#. In this embodiment, the low voltage system includes a fail-safe unit 18b in, for example, the interface 18.

The fail-safe signal FL outputted from the delay unit 50 serves as a trigger for:

turning on the soft-turnoff switching element 44; and instructing the drive controller 22 of each of the switching element S*# to deactivate the charge switching element 32 and the first and second discharge switching elements 36a and 36b of a corresponding one of the switching elements S*#.

The turn-on of the soft-turnoff switching element 44 enables a soft-turnoff task of the switching element S*# to be effected, thus dissipating the charge stored in the gate of the switching element S*# via the high-resistance discharge path, so that the switching element S*# is turned off slowly.

Because the high-resistance discharge path is higher in resistance than each of the first and second positive-charge dissipating paths, the turnoff speed of the switching element S*# via the high-resistance discharge path in the abnormal state is lower than that of the switching element S*# via each of the first and second positive-charge dissipating paths in the normal state. That is, if the turnoff speed of the switching element S*#, in other words, the rate of change of the switching element S*# from ON to OFF, were high with the magnitude of the collector current exceeding the threshold value, an excessive surge might be produced based on the turnoff of the switching element S*#.

The fail-safe unit 18b is configured to:

receive the fail-safe signal FL; and forcibly turn off the phototransistor of the photocouplers 18a for the respective switching elements S*# to set the drive signals Vi*# for the respective switching elements S*#, thus turning off the respective switching elements S*#.

The forcible turnoff of the respective switching elements S*# of the inverter INV and converter CNV results in shutdown of the inverter INV and converter CNV.

Next, a charging task and a discharging task for the gate of each switching element S*# carried out by the drive controller 22 of a corresponding drive unit DU will be described hereinafter if the switching element S*# is operating in the normal state.

First, the charging task will be described hereinafter.

The drive controller 22 is configured to perform the charging task for the gate of the switching element S*# using constant-current control. Specifically, the drive controller 22 controls a level of voltage to be applied to the gate of the charge switching element S*# to regulate the voltage drop across the resistor 30 to a target value of, for example, 1 V. This regulation adjusts, to a constant level, a charge current to be supplied to the gate of the switching element SY# from the series regulator 28 via the terminals T4 and T5, the resistor 30, the charge switching element 32, and the terminal T6. The charging task results in the suppression of a surge produced due to the turn-on of the switching element SY#. Note that the first and second discharge switching elements 36a and 36b are OFF during the period while the charging task is carried out.

Control of the constant-current control becomes more difficult with an increase in the gate voltage Vge of the switching element S*#. For this reason, in this embodiment, the output voltage Vom of the series regulator 28, which is actually applied to the gate of the switching element S*# as the gate voltage Vge, is set to be equal to or higher than the sum of: the voltage drop across the resistor 30, the voltage drop across the charge switching element S*#, and an upper limit of the gate voltage Vge. The upper limit of the gate voltage Vge corresponds to an upper limit of collector current as the saturation current for the switching element S*# when the switching element S*# is normally operating. This setting of the output voltage Vom, i.e. the gate voltage Vge, of the series regulator 28 makes it possible to prevent the controllability of the constant-current control from decreasing until the level of the gate voltage Vge reaches the upper limit of the gate voltage Vge.

Next, the discharging task will be described hereinafter.

The drive controller 22 is configured to perform the discharging task for the gate of the switching element S*# using active gate control. The active gate control is designed to change the number of the discharge paths, i.e. the total area of the discharging path, connected to the gate of the switching element S*# in the middle of the discharge period from the start of discharging the gate of the switching element S*# to the completion of the discharge from the gate of the switching element S*#. That is, the active gate control increases the rate of discharging the gate of the switching element S*# in at least an early stage in the discharge period, resulting in a reduction of both a surge and switching loss when the switching element S*# is turned from ON to OFF.

For example, the drive controller 22 keeps on each of the first and second discharge switching elements 36a and 36b during an off duration of the drive signal Vi*#, thus increasing the rate of dissipating electrical charge stored on the gate of the switching element S*#. Thereafter, the drive controller 22 turns off any one of the first and second discharge switching elements 36a and 36b, thus reducing the rate of dissipating electrical charge on the gate of the switching element S*#. Note that the charge switching element 32 is OFF during the period while the discharging task is carried out.

FIG. 3 schematically illustrates measurement results of how the gate voltage Vge, the collector-emitter voltage Vce, the sense voltage Vse, and the collector current Ic vary after the start of discharging the gate of the switching element S*# due to the turnoff of the switching element S*# at time t1A. In FIG. 3, a switching element S*# is abbreviated as "SW".

Particularly, the drive controller 22 according to this embodiment is configured to determine that the timing to change the rate of discharging the gate of the switching element S*# from a first value to a second value lower than the first value is set to predetermined time t2A. The timing to change the rate of discharging the gate of the switching element S*# will be referred to as "discharging-rate changing timing" hereinafter.

The time t2A is defined to time at which the collector-emitter voltage Vce of the switching element S*# is substantially in agreement with the terminal voltage of the high-voltage battery 12 (see FIG. 3). The first value of the discharging-rate changing timing corresponds to, for example, the sum of the resistances Ra and Rb, and the second value thereof corresponds to, for example, the resistance Ra or Rb. This determination of the discharging-rate changing timing delays the timing to reduce the rate of discharging the gate of the switching element S*# as much as possible, resulting in an effective reduction of a surge while reducing switching loss as low as possible.

In this embodiment, the drive controller 22 is configured to recognize the time t2A as the discharging-rate changing timing as a function of the level of the sense voltage Vse. Specifically, the drive controller 22 is configured to recognize the timing, at which the sense voltage Vse reaches a threshold voltage Vth1 after the start of the discharge from the gate of the switching element S*# at the time t1A, as the discharging-rate changing timing. Using the sense voltage Vse to recognize the discharging-rate changing timing is due to the fact that the timing at which the collector-emitter voltage Vce is substantially in agreement with the output DC voltage across the capacitor C can be correlated with the timing at which the sense voltage Vse reaches the threshold voltage Vth1.

Specifically, even if the electromagnetic force increases up to a certain level, no excessively high voltage is applied to the switching element SY# while the voltage across both ends of the conductive path of the switching element SY#, i.e. the collector-emitter voltage Vce, is lower than the output DC voltage across the capacitor C. Thus, the timing at which the collector-emitter voltage Vce reaches the output DC voltage across the capacitor C correlates with the timing at which the sense voltage Vse greatly rises to reach its peak; the timing at which the sense voltage Vse greatly rises is close to the time t2A at which the sense voltage Vse reaches the threshold voltage Vth1. Using this relationship between the collector-emitter voltage Vce and the sense voltage Vse, the drive controller 22 is configured to recognize the discharging-rate changing timing.

As described above, the sense voltage Vse rapidly rises as a spike at time close to the time t2A within the period during which the switching element S*# is changed from ON to OFF. The spike of the sense voltage Vse is due to a surge superimposed on the sense voltage Vse via parasitic capacitance between the emitter and collector of the switching element S*#.

In addition, the drive controller 22 is configured to determine whether the sense voltage Vse is equal to or lower than a threshold voltage Vth2 set to be lower than the threshold voltage Vth1 during an on duration of the switching element S*#. The second threshold voltage Vth2 serves as a first threshold value for the sense voltage Vse, and the first threshold voltage Vth1 serves as a second threshold value therefor.

Upon determination that the sense voltage Vse is equal to or lower than the threshold voltage Vth2, the drive controller 22 is configured to increase the rate of discharging the gate of the switching element S*# without performing the active gate control, thus disabling the active gate control. The disabling of the active gate control aims to enhance the effect of decreasing switching loss.

Specifically, the higher the collector current during an on duration of the switching element S*# is, the higher the magnitude of a surge produced due to the turnoff of the switching element S*# is. This characteristic is because the higher the collector current during an on duration of the switching element S*# is, the higher the rate of decreasing the collector current is within the period during which the switching element S*# is changed from ON to OFF. In view of the characteristic, if the collector current during an on duration of the switching element S*# is low, the magnitude of a surge produced at the turnoff of the switching element S*# becomes low. This results in an increase in a margin of voltage between the collector-emitter voltage Vce and its acceptable upper limit. Thus, in this case of low collector-current, an increase in the rate of discharging the gate of the switching element S*# to perform the discharging task can maintain, at a high level, the reliability of the switching element S*#. In other words, it is possible to perform the discharging task using the active gate control by increasing the rate of discharging the gate of the switching element S*# without effecting on the reliability of the switching element S*#. Thus, disabling the active gate control if the collector current during an on duration of the switching element S*# is low increases the effect of decreasing switching loss, thus improving fuel economy of the motor vehicle.

Note that the threshold voltage Vth2 is set to be lower than the reference voltage Vref used to determine whether to perform a soft-turnoff task to discharge the gate of the switching element S*# via the high-resistance discharge path.

In addition, FIG. 4 schematically illustrates measurement results of how the gate voltage Vge, the collector-emitter voltage Vce, the sense voltage Vse, and the collector current Ic vary after the start of charging the gate of the switching element S*# due to the turn-on of the switching element S*# at time t3A. In FIG. 4, a switching element S*# is abbreviated as "SW".

As illustrated in FIG. 4, as in the case of the period during which the switching element S*# is changed from ON to OFF, the sense voltage Vse rapidly rises as a spike within the period during which the switching element S*# is changed from OFF to ON. Such a spike is produced based on the following reason:

If one of series-connected high-side and low-side switching elements S*p and S*n of one leg is turned on, a recovery current flows through the flywheel diode connected antiparallel to the other of the switching elements S*p and S*n. Due to the recovery current, a surge is produced across the flywheel diode and the other of the switching elements S*p and S*n. The surge is superimposed on the sense voltage Vse of the one of the switching elements S*p and S*n via parasitic capacitance between the emitter and collector of the one of the switching elements S*p and S*n. This superimposition results in a spike with the period during which the switching element S*# is changed from OFF to ON.

The occurrence of a spike during an on state of the switching element S*# may cause various malfunctions in the drive unit DU. As one example of these malfunctions, the sense voltage Vse may exceed the threshold voltage Vth2 due to a spike although the collector current is sufficiently low. In this case, the sense voltage Vse exceeding the threshold voltage Vth2 may cause the drive controller 22 to perform the active gate control by mistake although there is room to disable the active gate control to increase the switching speed in the discharging task. This may result in a reduction of the effect of decreasing switching loss.

As another example of these malfunctions, the sense voltage Vse may exceed the threshold voltage Vth1 due to a spike although the charging task is performed to change the switching element S*# from OFF to ON, resulting in the discharging task based on the active gate control being performed erroneously.

Figure 5:
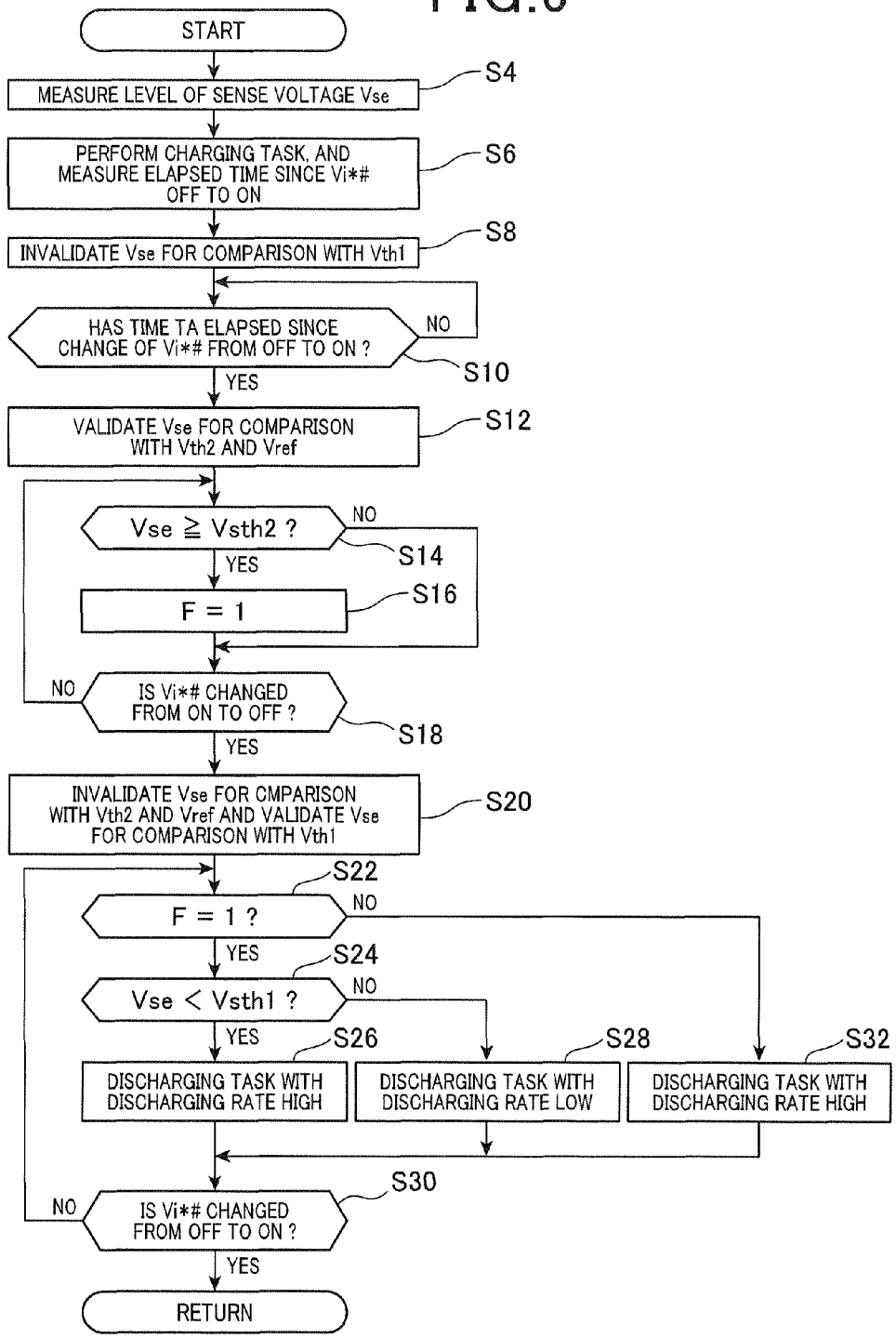
FIG. 5 is a flowchart schematically illustrating an example of a charging and discharging routine carried out by each drive unit of the control system illustrated in FIG. 1.

In view of these circumstances, the drive controller 22 of each drive unit DU is configured to perform a charging and discharging routine for the gate of the switching element S*# during an on duration of the drive signal g*# in accordance with the following procedure illustrated in FIG. 5. Note that the drive controller 22 of each drive unit DU can be configured as a programmed logic circuit, a hard-wired logic circuit, or the combination of hardwired-logic and programmed-logic hybrid circuits. The drive controller 22 is configured to repeatedly carry out the charging and discharging routine each time the drive signal g*# is turned from OFF to ON, in other words, each time the drive signal Vi*# is turned from the high level to the low level.

Because the voltage drop across the resistor 38 is constantly inputted to the drive controller 22, the drive controller 22 constantly measures the voltage drop across the resistor 38 as a level of a sense voltage Vse in step S4.

When the drive signal Vi*# inputted to the drive controller 22 is turned from the off command, i.e. the high level, to the on command, i.e. the low level, the drive controller 22 performs the charging task to turn on the charge switching element 32 while turning off at least one of the first and second discharge switching elements 36a and 36b, which have been ON in step S6. In step S6, the drive controller 22 also starts to measure time elapsed since the change of the drive signal Vi*# from the off command to the on command in step S6.

In addition, in response to the change of the drive signal Vi*# from the off command to the on command, the drive controller 22 invalidates the measured level of the sense voltage Vse to be used for comparison with the threshold voltage Vth1, which has been validated in the previous discharging task described later in step S8. The operation in step S8 disables the measured level of the sense voltage Vse from being used to determine the discharging-rate changing timing.

Next, in step S10, the drive controller 22 determines whether a preset first threshold time TA has elapsed since the change of the drive signal Vi*# from the off command to the on command.

That is, the operation in step S10 is required for the drive controller 22 to wait until a spike, which may be produced due to the turn-on of the drive signal g*#, is sufficiently suppressed. In other words, the first threshold time TA is required for a spike, which may be produced due to the turn-on of the drive signal g*#, to be sufficiently suppressed. That is, the first threshold time TA is required to make the measured value of the sense voltage Vse stable. This is because, immediately after the drive signal Vi*# is changed to the on state, the measured value of the sense voltage Vse may be unstable due to, for example, such a surge, noise, and the instability of the collector current flowing through the switching element S*#.

Specifically, upon determination that the first threshold time TA has not elapsed since the change of the drive signal Vi*# from the off command to the on command (NO in step S10), the drive controller 22 waits to carry out the operation in step S12. Otherwise, upon determination that the first threshold time TA has elapsed since the change of the drive signal Vi*# from the off command to the on command (YES in step S10), the drive controller 22 carries out the operation in step S12.

In step S12, the drive controller 22 validates the measured level of the sense voltage Vse to be used for comparison with the threshold voltage Vth2. The operation in step S12 enables the measured level of the sense voltage Vse to be used to determine whether to perform a task of disabling the active gate control.

Next, the drive controller 22 determines whether the measured level of the sense voltage Vse becomes equal to or higher than the threshold voltage Vth2 until the time when the drive signal Vi*# is changed from the on command to the off command in steps S14, S16, and S18. These operations in steps S14, S16, and S18 aim to determine whether to perform the task of disabling the active gate control.

Specifically, the drive controller 22 determines whether the measured level of the sense voltage Vse becomes equal to or higher than the threshold voltage Vth2 in step S14.

At that time, because the operation in step S14 is carried out after the lapse of the first threshold time TA since the change of the drive signal Vi*# to the on command, it is accurately recognize the relationship between the measured level of the sense voltage Vse and the threshold voltage Vth2. This results in an accurate recognition of a certain margin of voltage between the collector-emitter voltage Vse and an acceptable upper limit therefor as a function of the accurately recognized relationship between the measured level of the sense voltage Vse and the threshold voltage Vth2.

Upon determination that the measured level of the sense voltage Vse becomes equal to or higher than the threshold voltage Vth2 (YES in step S14), the drive controller 22 sets a disabling flag F as an identifier to 1 indicative of non-execution of the task of disabling the active gate control in step S16. The disabling flag F, for example, is in the form of a bit (i.e. 0 or 1). The disabling flag F of 0 is indicative of execution of the task of disabling the active gate control. An initial value of the disabling flag F is set to 0. After the operation in step S16, the drive controller 22 carries out the operation in step S18.

Otherwise, upon determination that the measured level of the sense voltage Vse is lower than the threshold voltage Vth2 (NO in step S14), the drive controller 22 carries out the operation in step S18 while skipping the operation in step S16, thus keeping the disabling flag F at 0.

In step S18, the drive controller 22 determines whether the drive signal Vi*# is changed from the on command to the off command. Upon determination that the drive signal Vi*# is not changed from the on command to the off command (NO in step S18), the drive controller 22 repeats the operations in steps S14, S16, and S18. As a result, upon determination that the drive signal Vi*# is changed from the on command to the off command (YES in step S18), the drive controller 22 carries out the operation in step S20.

In step S20, the drive controller 22 invalidates the measured level of the sense voltage Vse to be used for comparison with the threshold voltage Vth2, and validates the measured level of the sense voltage Vse to be used for comparison with the threshold voltage Vth1. The operation in step S20 disables the measured level of the sense voltage Vse to be used to determine whether to perform a task of disabling the active gate control, and enables the measured level of the sense voltage Vse to be used to determine the discharging-rate changing timing.

Next, the drive controller 22 determines whether the disabling flag F is set to 1 in step S22.

Upon determination that the disabling flag F is set to 1 (YES in step S22), the drive controller 22 determines not to perform the task of disabling the active gate control, and therefore carries out the discharging task using the operation in one of steps S24, S26, and S28.

Specifically, the drive controller 22 determines whether the measured level of the sense voltage Vse is lower than the threshold voltage Vth1 in step S24. Upon determination that the measured level of the sense voltage Vse is lower than the threshold voltage Vth1 (YES in step S24), the drive controller 22 carries out the operation in step S26. In step S26, the drive controller 22 turns on both the first and second discharge switching elements 36a and 36b and keeps them on in step S26 until the measured level of the sense voltage Vse becomes equal to or higher than the threshold voltage Vth1 (NO in step S24). That is, the operation to keep on the first and second discharge switching elements 36a and 36b in step S26 increases the rate of discharging the gate of the switching element S*#.

Upon determination that the measured level of the sense voltage Vse becomes equal to or higher than the threshold voltage Vth1 (NO in step S24), the drive controller 22 turns off any one of the first and second discharge switching elements 36a and 36b and keeps off it based on the active gate control in step S28. The operation to keep off any one of the first and second discharge switching elements 36a and 36b in step S28 decreases the rate of discharging the gate of the switching element S*#.

That is, the first positive-charge dissipating path including the first discharge switching element 36a and the resistor 34a, and the second positive-charge dissipating path including the second discharge switching element 36b and the resistor 34b serve as, for example, a discharging-rate changing module adapted to change the rate of discharging the gate of the switching element S*#.

The operation in step S4 by the drive controller 22 serve as, for example, a measuring module configured to measure a value of a parameter as a function of the collector current flowing through the conductive path of the switching element S*#.

The operations in steps S10, S12, S14, S16, S18, S20, S22, S24, S26, and S28 by the drive controller 22 serve as, for example, a discharging control module configured to:

control the discharging-rate changing module as a function of the value of the parameter to select one of the first value and the second value as the rate of discharging the gate of the switching element S*# upon the drive signal Vi*# directing a change from the on command to the off command; and discharge the gate of the switching element S*# using the selected one of the first value and the second value as the rate of discharging the gate of the switching element S*#.

Otherwise, upon determination that the disabling flag F is set to 0 (NO in step S22), the drive controller 22 determines to perform the task of disabling the active gate control, in other words, determines not to perform the active gate control. Then, the drive controller 22 turns on both the first and second discharge switching elements 36a and 36b and keeps them on in step S32.

After one of the operations in steps S26, S28, and S32, the drive controller 22 determines whether the drive signal V*# is changed from the off command to the on command in step S30.

That is, the drive IC 22 repeatedly performs one of these operations in step S26, S28, and S32 as long as the drive signal V*# is not changed from the off command to the on command (NO in step S30), in other words, until the drive signal V*# is changed from the off command to the on command.

Upon determination that the drive signal Vi*# is changed from the off command to the on command (YES in step S30), the routine returns to step S6, and the drive controller 22 carries out the operations in steps S6 to S30 set forth above.

Note that a spike produced during the period when the switching element S*# is turned from OFF to ON or from ON to OFF may cause the soft-turnoff switching element 44 to be turned on, so that the gate of the switching element S*# may be discharged via the high-resistance discharge path erroneously. This may slow the turnoff speed of the switching element S*# by mistake.

Thus, the drive controller 22 according to this embodiment performs a soft-turnoff disabling task to invalidate the measured level of the sense voltage Vse to be used to determine whether to perform the soft-turnoff task.

Specifically, in step S12, the drive controller 22 validates the measured level of the sense voltage Vse to be used for comparison with the reference voltage Vref. The operation in step S12 enables the measured level of the sense voltage Vse to be used to determine whether to perform the soft-turnoff task.

In addition, in step S20, the drive controller 22 invalidates the measured level of the sense voltage Vse to be used for comparison with the reference voltage Vref. The operation in step S12 enables the measured level of the sense voltage Vse to be used to determine whether to perform the soft-turnoff task.

In other words, the drive controller 22 disables the measured level of the sense voltage Vse to be used to determine whether to perform the soft-turnoff task within the first period until the first threshold time TA has elapsed since the change of the drive signal Vi*# from the off command to the on command and also within the second period during the on duration of the drive signal Vi*#.

The soft-turnoff disabling task prevents the soft-turnoff task from being carried out erroneously.

Figure 6:
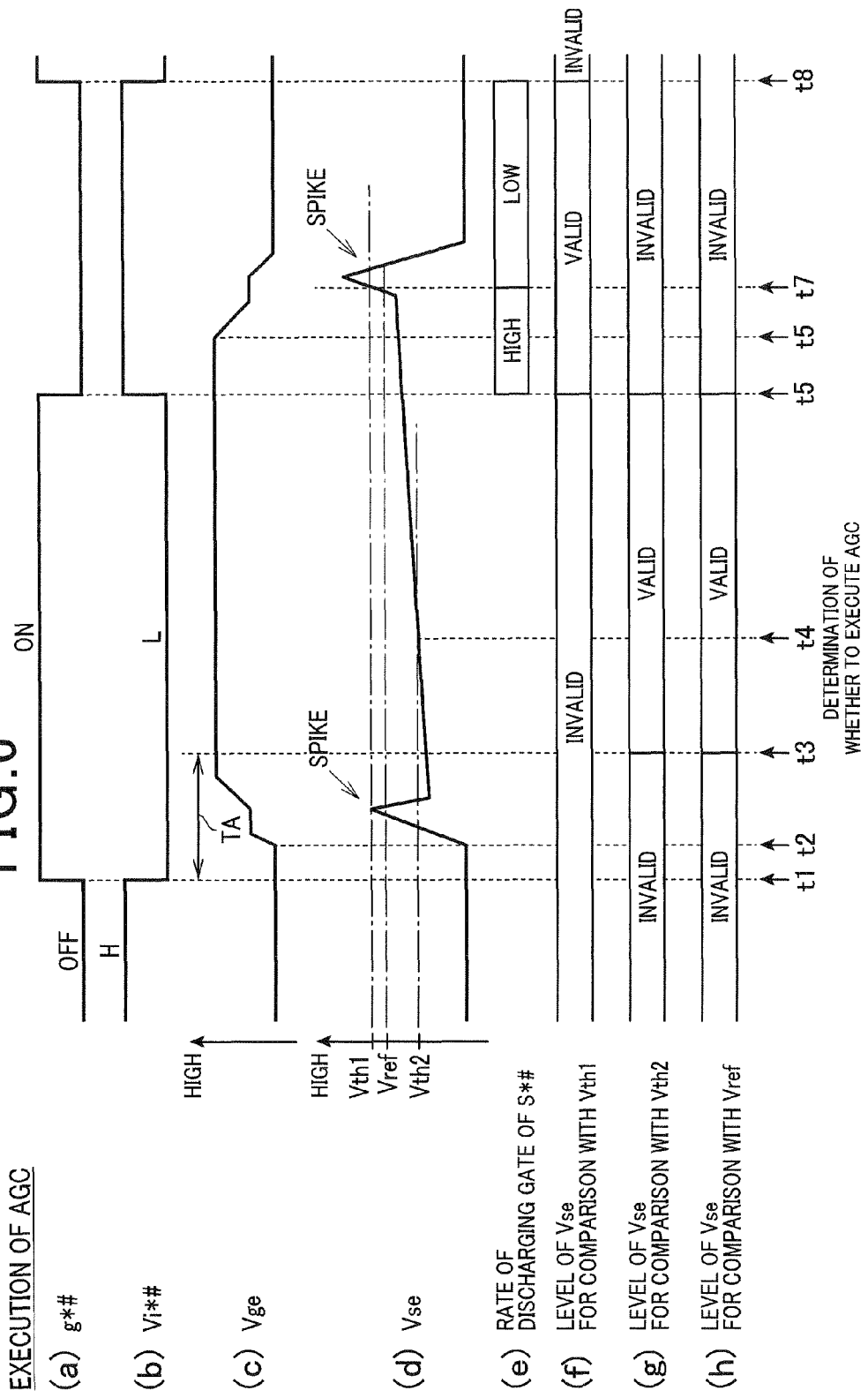
FIG. 6 is a timing chart schematically illustrating an example of specific operations of variables correlated with the charging and discharging routine using active gate control.
Figure 7:
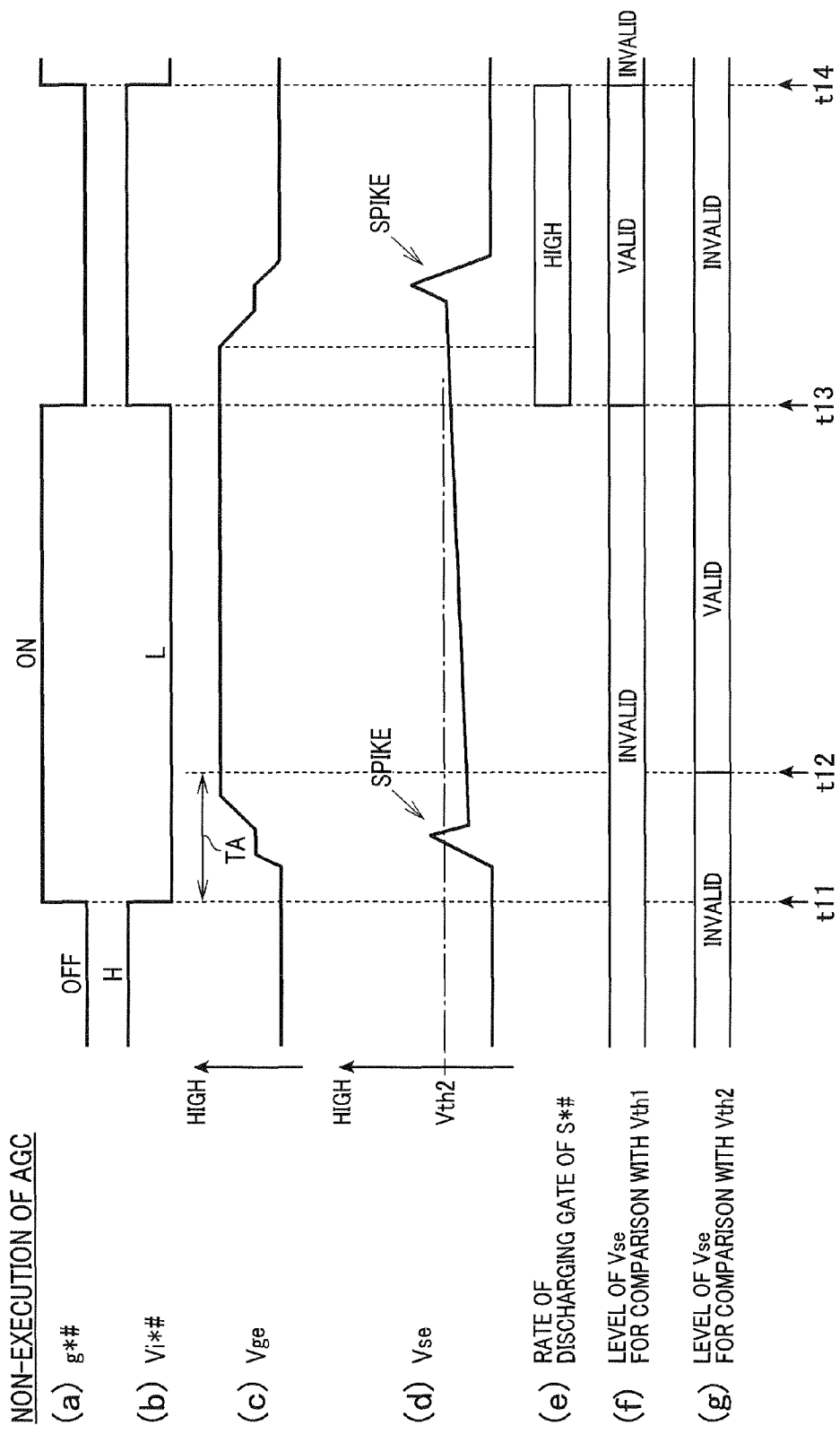
FIG. 7 is a timing chart schematically illustrating an example of specific operations of the variables correlated with the charging and discharging routine while the active gate control is not used.

FIGS. 6 and 7 schematically illustrate specific operations of variables correlated with the charging and discharging routine illustrated in FIG. 5.

Particularly, FIG. 6 schematically illustrates specific operations of the variables correlated with the charging and discharging routine using the active gate control. In FIGS. 6 and 7, active gate control is abbreviated as "AGC".

Let us describe the specific operations of the variables correlated with the charging and discharging routine using the active gate control with reference to FIG. 6.

How the drive signal g*# varies is illustrated in (a) of FIG. 6, and how the drive signal Vi*# varies is illustrated in (b) of FIG. 6. How the gate voltage Vge varies is illustrated in (c) of FIG. 6, and how the sense voltage Vse varies is illustrated in (d) of FIG. 6. How the rate of dissipating electrical charge stored on the gate of the switching element S*# as the rate of discharging the gate of the switching element S*# is illustrated in (e) of FIG. 6. How the sense voltage Vse to be used for comparison with the threshold voltage Vth1 varies as "valid" or "invalid" is illustrated in (f) of FIG. 6, and how the sense voltage Vse to be used for comparison with the threshold voltage Vth2 varies as "valid" or "invalid" is illustrated in (g) of FIG. 6. How the sense voltage Vse to be used for comparison with the reference voltage Vref varies as "valid" or "invalid" is illustrated in (h) of FIG. 6.

When a drive signal Vi*# inputted to the drive unit DU is changed from the off command to the on command at time t1, the charging task for the gate of the switching element S*# is started at the time t1. This charging task results in the gate of the switching element S*# starting to rise from time t2 (see steps S6 and S8). Note that the reason why it takes a certain period before the gate voltage Vge starts to rise in response to the change of the drive signal Vi*# from the off command to the on command is signal delay in the drive unit DU.

Note that, as illustrated in (c) FIG. 6, during the on command of the drive signal Vi*#, the gate voltage Vge increases at a predetermined first gradient first. Then, the gate voltage Vge stays at a middle potential between 0 V and the output voltage level Vom of the series regulator 28.

Thereafter, the gate voltage Vge increases at a predetermined second gradient again. The period during which the gate voltage Vge has stayed at the middle potential will be referred to as a mirror period hereinafter. The mirror period is defined depending on the characteristics of a corresponding switching element S*#.

After the start of the increase in the gate voltage Vge, the measured level of the sense voltage Vse to be used for comparison with the threshold voltage Vth2 is validated at the time (see t3) when the first threshold time TA has elapsed since the change of the drive signal Vi*# from the off command to the on command (see step S12). Thereafter, when it is determined that the measured level of the sense voltage Vse is equal to or higher than the threshold voltage Vth2 at time t4 within the period during which the measured level of the sense voltage Vse to be used for comparison with the threshold voltage Vth2 is validated (see YES in step S14), the disabling flag F is set to 1 (see step S16). The disabling flag F being set to 1 disables the drive controller 22 from executing the task of disabling the active gate control. In other words, the disabling flag F being set to 1 enables the drive controller 22 to execute the active gate control.

Thereafter, when the drive signal Vi*# is changed from the on command to the off command at time t5 (see YES in step S18), the measured level of the sense voltage Vse to be used for comparison with the threshold voltage Vth2 is invalidated, and the measured level of the sense voltage Vse to be used for comparison with the threshold voltage Vth1 is validated (see step S20).

At that time, because the disabling flag F is 1 so that the determination in step S22 is YES, the active gate control is carried out in steps S26 and S28. Specifically, while the measured level of the sense voltage Vse is lower than the threshold voltage Vth1 (see YES in step S24), the gate of the switching element S*# is discharged via both the first and second positive-charge dissipating paths, so that a decrease in the gate voltage Vge is started at time t6. At that time, the rate of discharging the gate of the switching element S*# is set to a higher value (see step S26 and the period from the time t5 to time t7 in FIG. 6).

Note that, as in the case of the increase in the gate voltage Vge, during the off command of the drive signal Vi*#, the gate voltage Vge decreases at a predetermined first gradient first. Then, the gate voltage Vge stays at the middle potential during the mirror period, and thereafter decreases at a predetermined second gradient again.

When the measured level of the sense voltage Vse reaches the threshold voltage Vth1 (see NO in step S24), the active gate control is carried out, so that the gate of the switching element S*# is discharged via one of the first and second positive-charge dissipating paths. This changes the rate of discharging the gate of the switching element S*# from the higher value to a lower value (see step S28 and the time t7 in FIG. 6).

Thereafter, when the drive signal Vi*# is changed from the off command to the on command at time t8, the measured level of the sense voltage Vse to be used for comparison with the threshold voltage Vth1 is invalidated (see step S8).

In addition, the soft-turnoff task is performed within the first period until the first threshold time TA has elapsed since the change of the drive signal Vi*# from the off command to the on command (see the period before the time t1), and the second period during the on duration of the drive signal Vi*# (see the period from the time t5 to the time t8). The soft-turnoff disabling task prevents the soft-turnoff task from being carried out even if the level of the sense voltage Vge exceeds the reference voltage Vref due to a surge produced when the switching element S*# is changed from ON to OFF or OFF to ON.

Next, let us describe the specific operations of the variables correlated with the charging and discharging routine while the active gate control is not used with reference to FIG. 7. (a) to (g) of FIG. 7 correspond to (a) to (g) of FIG. 6. Note that, in FIG. 7, the illustration of how the sense voltage Vse to be used for comparison with the reference voltage Vref varies as "valid" or "invalid" is omitted because it is identical to that in (h) of FIG. 6.

When a drive signal Vi*# inputted to the drive unit DU is changed from the off command to the on command at time t11, the charging task for the gate of the switching element S*# is started at the time t11 so that the gate of the switching element S*# starts to rise (see steps S6 and S8).

Thereafter, the measured level of the sense voltage Vse to be used for comparison with the threshold voltage Vth2 is validated at the time (see t12) when the first threshold time TA has elapsed since the change of the drive signal Vi*# from the off command to the on command (see YES in step S10 and step S12).

Thereafter, it is determined that the measured level of the sense voltage Vse is kept to be lower than the threshold voltage Vth2 within the period from the time t12 to time t13 during which the measured level of the sense voltage Vse to be used for comparison with the threshold voltage Vth2 is validated (see NO in step S14). This results in the disabling flag F being kept to 0 (see the skip of the operation in step S16). The disabling flag F being set to 0 enables the drive controller 22 to execute the task of disabling the active gate control, in other words, disables the drive controller 22 from executing the active gate control.

Thereafter, when the drive signal Vi*# is changed from the on command to the off command at the time t13 (see YES in step S18), the measured level of the sense voltage Vse to be used for comparison with the threshold voltage Vth2 is invalidated, and the measured level of the sense voltage Vse to be used for comparison with the threshold voltage Vth1 is validated (see step S20).

At that time, because the disabling flag is 0 so that the determination in step S22 is NO, the active gate control is not carried out. Specifically, the gate of the switching element S*# is discharged via both the first and second positive-charge dissipating paths during the period from the time t13 to time t14, so that the rate of discharging the gate of the switching element S*# is kept to the higher value (see step S32).

Thereafter, when the drive signal Vi*# is changed from the off command to the on command at the time t14, the measured level of the sense voltage Vse to be used for comparison with the threshold voltage Vth1 is invalidated (see step S8).

Next, technical effects achieved by the charging and discharging routine for the gate of the switching element S*# during an on duration of the drive signal g*# according to this embodiment will be described hereinafter with reference to FIG. 8.

Figure 8:
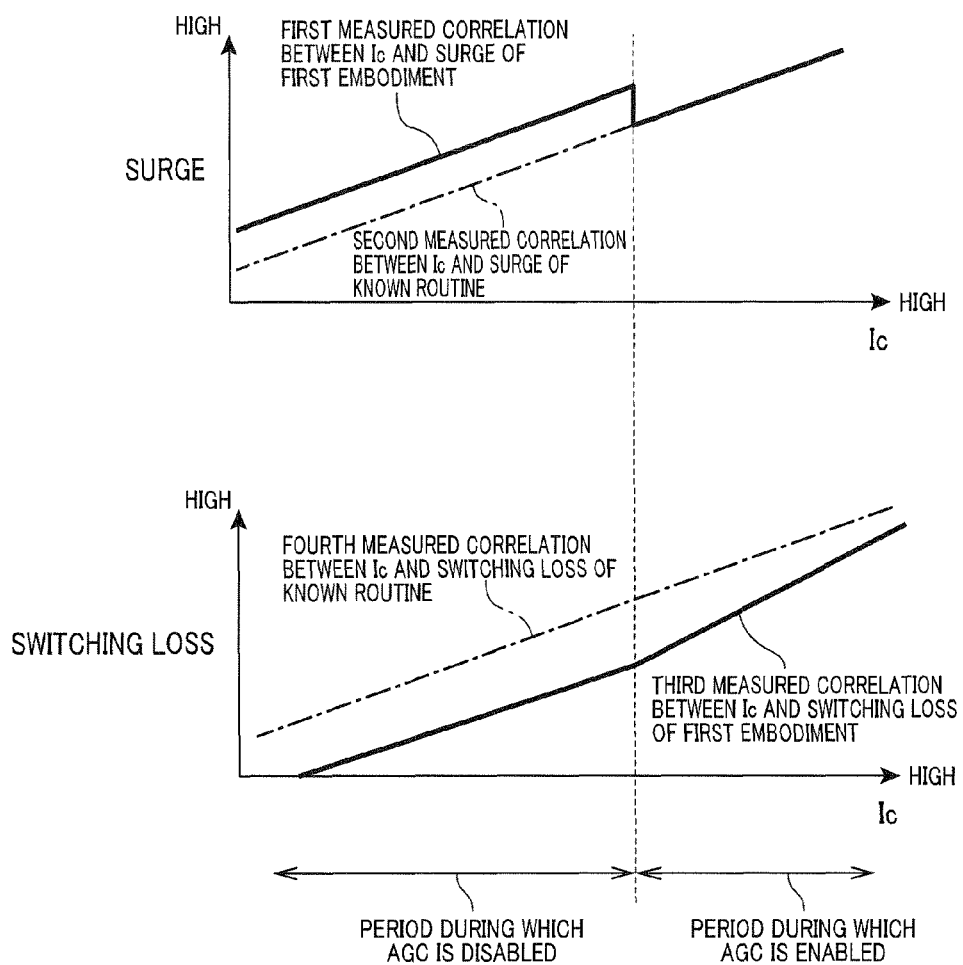
FIG. 8 are first and second graphs, the first graph schematically illustrating a first measured correlation between collector current and surge voltage for each switching element according to the first embodiment and a second measured correlation therebetween according to a known example, the second graph schematically illustrating a third measured correlation between collector current and switching loss for each switching element according to the first embodiment and a fourth measured correlation therebetween according to the known example.

FIG. 8 schematically illustrates a first measured correlation between collector current Ic and surge voltage for each switching element S*# when the charging and discharging routine according to this embodiment is applied to the switching element S*# (see thick solid line in the upper side of FIG. 8). FIG. 8 schematically illustrates a second measured correlation between collector current Ic and surge voltage for each switching element S*# when a known charging and discharging routine using a positive-charge dissipating path having a combined resistance, i.e. a fixed resistance, of the resistors 34a and 34b connected in parallel (see dashed line in the upper side of FIG. 8).

In addition, FIG. 8 schematically illustrates a third measured correlation between collector current Ic and switching loss for each switching element S*# when the charging and discharging routine according to this embodiment is applied to the switching element S*# (see thick solid line in the lower side of FIG. 8). FIG. 8 schematically illustrates a fourth measured correlation between collector current Ic and switching loss for each switching element S*# when the known charging and discharging routine using the positive-charge dissipating path having the combined resistance of the resistors 34a and 34b connected in parallel (see dashed line in the lower side of FIG. 8).

FIG. 8 demonstrates that switching loss of each switching element S*# resulted from the charging and discharging routine according to this embodiment is reduced in comparison to that of each switching element S*# resulted from the known charging and discharging routine using the positive-charge dissipating path having the combined resistance of the resistors 34a and 34b connected in parallel. Note that the reason why switching loss within the period during which the task of disabling the active gate control (AGC), resulted from the charging and discharging routine according to this embodiment, is reduced is that the task of disabling the active gate control increases the switching speed of the switching element S*#.

As described above, the drive unit DU for each switching element S*# according to this embodiment is configured to perform the task of disabling the active gate control when determining that a predetermined condition is met. The predetermined condition is that:

the first threshold time TA has elapsed since the change of the drive signal Vi*# from the off command to the on command; and the measured level of the sense voltage Vse is kept to be lower than the second threshold Vth2 within the period during which the drive signal Vi*# directs the on command.

This configuration enables the measured level of the sense voltage Vse to be used for determination of whether to perform the task of disabling the active gate control independently of a spike that may be produced due to the turn-on of the drive signal g*#.

Thus, it is possible to maintain, at a high level, the effect of reducing switching loss independently of a spike that may be produced due to the turn-on of the drive signal g*#, thus improving fuel economy of the motor vehicle in which the drive unit DU for each switching element S*# is installed.

The drive unit DU for each switching element S*# is configured to define a validated period for the measured level of the sense voltage Vse to be used for comparison with the threshold voltage Vth2. The validated period is the period during which the drive signal Vi*# directs the on command after the lapse of the first threshold time TA since the change of the drive signal Vi*# from the off command to the on command. This configuration enables the drive controller 22 to reliably determine whether there is a need to perform the task of disabling the active gate control.

The drive unit DU for each switching element S*# is configured to validate the measured level of the sense voltage Vse to be used for recognition of the discharging-rate changing timing within only the period during which the drive signal Vi*# directs the off command. This configuration prevents the discharging task from being carried out erroneously although the charging task for the gate of the switching element S*# is instructed by the drive signal g*#.

The drive unit DU for each switching element S*# is configured to recognize the discharging-rate changing timing as a function of the sense voltage Vse. This configuration eliminates the need to provide a circuit structure installed in the low voltage system and designed to support the drive unit DU to recognize the discharging-rate changing timing. Thus, it is possible to prevent the scale of the drive unit DU from expanding into the low voltage system.

The drive unit DU for each switching element S*# is configured to perform the soft-turnoff disabling task of the switching element S*# to thereby prevent slow turnoff of the switching element S*#. This configuration reliably prevents the soft-turnoff disabling task from being carried out by mistake due to a spike produced during the change of the drive voltage g*# from one of the on command and the off command to the other thereof.

Second Embodiment

A control system for controlling the motor-generator 10 according to a second embodiment of the present disclosure will be described with reference to FIGS. 9A and 9B.

The structure and/or functions of the control system according to the second embodiment are mainly identical to those of the control system according to the first embodiment except for the following points. So, the different points mainly will be described hereinafter.

The charging and discharging routine for each switching element S*# according to the second embodiment is configured to validate the measured level of the sense voltage Vse to be used for comparison with the threshold voltage Vth2 as long as:

the drive signal Vi*# directs the on command; and the measured level of the sense voltage Vse has been equal to or higher than a preset voltage level Vα.

The voltage level Vα is previously set to a voltage level corresponding to the timing at which a spike produced based on the change of the drive signal Vi*# from the off command to the on command is sufficiently suppressed. For example, the voltage level can be set to be equal to or higher than a predetermined threshold voltage at which the switching element S*# has been completely ON; the predetermined threshold voltage is the mirror voltage or thereabout.

FIG. 9A schematically illustrates the specific operations of the variables correlated with the charging and discharging routine while the active gate control is not used according to this embodiment. (a) to (e) of FIG. 9A correspond to (a) to (d), and (g) of FIG. 6. Note that, in FIG. 9A, the illustration of how the rate of discharging the gate of the switching element S*# varies and that of how the sense voltage Vse to be used for comparison with the threshold voltage Vth1 varies as "valid" or "invalid" are omitted because they are identical to those in (e) and (f) of FIG. 6.

When a drive signal Vi*# inputted to the drive unit DU is changed from the of command to the on command at time t21, the charging task for the gate of the switching element S*# is started at the time t21 so that the gate of the switching element S*# starts to rise (see steps S6 and S8).

Thereafter, the measured level of the sense voltage Vse to be used for comparison with the threshold voltage Vth2 is validated at the time (see t22) when the measured level of the sense voltage Vse has been equal to or higher than the preset voltage level Vα (see YES in step S10A of FIG. 9B and step S12). The operation in step S10A by the drive controller 22 serves as, for example, the discharging control module.

Thereafter, it is determined that the measured level of the sense voltage Vse is kept to be lower than the threshold voltage Vth2 within the period from the time t12 to time t23 during which the measured level of the sense voltage Vse to be used for comparison with the threshold voltage Vth2 is validated (see NO in step S14). This results in the disabling flag F being kept to 0 (see the skip of the operation in step S16). The disabling flag F being set to 0 enables the drive controller 22 to execute the task of disabling the active gate control.

Thereafter, when the drive signal Vi*# is changed from the on command to the off command at the time t23 (see YES in step S18), the measured level of the sense voltage Vse to be used for comparison with the threshold voltage Vth2 is invalidated, and the measured level of the sense voltage Vse to be used for comparison with the threshold voltage Vth1 is validated (see step S20).

Other operations of the variables correlated with the charging and discharging routine according to this embodiment are substantially identical to corresponding operations of the variables correlated with the charging and discharging routine according to the first embodiment.

Specifically, the drive unit DU for each switching element S*# according to this embodiment is configured to perform the task of disabling the active gate control when determining that a predetermined condition is met. The predetermined condition is that the measured level of the sense voltage Vse has been equal to or higher than the preset voltage level Vα, and the drive signal Vi*# directs the on command. The voltage level Vα is previously set to a voltage level corresponding to the timing at which a spike produced based on the change of the drive signal Vi*# from the off command to the on command is sufficiently suppressed.

This configuration enables the measured level of the sense voltage Vse to be used for determination of whether to perform the task of disabling the active gate control independently of a spike that may be produced due to the turn-on of the drive signal g*#. Thus, the configuration of each drive unit DU according to the second embodiment achieves the same effects as the configuration of each drive unit DU according to the first embodiment.

Third Embodiment

A control system for controlling the motor-generator 10 according to a third embodiment of the present disclosure will be described with reference to FIGS. 10A and 10B.

The structure and/or functions of the control system according to the second embodiment are mainly identical to those of the control system according to the first embodiment except for the following points. So, the different points mainly will be described hereinafter.

The charging and discharging routine for each switching element S*# according to the third embodiment is configured to validate the measured level of the sense voltage Vse to be used for comparison with the threshold voltage Vth2 if it is determined that the measured level of the sense voltage Vse at the timing when the drive signal Vi*# is changed from the on command to the off command is lower than the threshold voltage Vth2.

FIG. 10A schematically illustrates the specific operations of the variables correlated with the charging and discharging routine while the active gate control is not used according to this embodiment. (a) to (e) of FIG. 10 correspond to (a) to (d), and (g) of FIG. 6. Note that, in FIG. 10A, the illustration of how the rate of discharging the gate of the switching element S*# varies and that of how the sense voltage Vse to be used for comparison with the threshold voltage Vth1 varies as "valid" or "invalid" are omitted because they are identical to those in (e) and (f) of FIG. 6.

When a drive signal Vi*# inputted to the drive unit DU is changed from the off command to the on command at time t31, the charging task for the gate of the switching element S*# is started at the time t31 so that the gate of the switching element S*# starts to rise (see steps S6 and S8 of FIG. 10B).

After the operation in step S8, the routine proceeds to step S13 of FIG. 10B. Specifically, the drive controller 22 determines whether the drive signal Vi*# is changed from the low level to the high level in step S13

Upon determination that that the drive signal Vi*# is not changed from the low level to the high level (NO in step S13), the drive controller 22 repeats the operation in step S13. As a result, upon determination that the drive signal Vi*# is changed from the low level to the high level (YES in step S13), the drive controller 22 carries out the operation in step S14a of FIG. 10B.

Specifically, the drive controller 22 validates the measured level of the sense voltage Vse to be used for comparison with the threshold voltage Vth2 in step S14a (see time t32). Then, the drive controller 22 determines whether the measured level of the sense voltage Vse becomes equal to or higher than the threshold voltage Vth2 at the timing when the drive signal Vi*# is changed from the on command to the off command (see step S14b and the time t32).

Upon determination that the measured level of the sense voltage Vse is equal to or higher than the threshold voltage Vth2 at the timing when the drive signal Vi*# is changed from the on command to the off command (YES in step S14b and the solid line indicative of transition of the sense voltage Vse at the time t32)), the drive controller 22 sets the disabling flag F to 1 indicative of non-execution of the task of disabling the active gate control in step S16. Thereafter, the routine proceeds to step S20 set forth above. That is, the active gate control is carried out after the time t32.

Otherwise, upon determination that the measured level of the sense voltage Vse is lower than the threshold voltage Vth2 at the timing when the drive signal Vi*# is changed from the on command to the off command (NO in step S14b and the dashed line indicative of transition of the sense voltage Vse at the time t32), the drive controller 22 carries out the operation in step S20 while skipping the operation in step S16, thus keeping the disabling flag F at 0.

Thus, the active gate control is disabled after the time t32.

The operations in steps S13, 14a, and 14b by the drive controller 22 serve as, for example, the discharging control module.

Other operations of the variables correlated with the charging and discharging routine according to this embodiment are substantially identical to corresponding operations of the variables correlated with the charging and discharging routine according to the first embodiment.

Specifically, the drive unit DU for each switching element S*# according to this embodiment is configured to validate the measured level of the sense voltage Vse at the timing t32 when the drive signal Vi*# is changed from the on command to the off command.

This configuration enables the measured level of the sense voltage Vse to be used for determination of whether to perform the task of disabling the active gate control independently of a spike that may be produced due to the turn-on of the drive signal g*#. Thus, the configuration of each drive unit DU according to the second embodiment achieves the same effects as the configuration of each drive unit DU according to the first embodiment.

In addition, the configuration prevents the switching element S*# from driven erroneously due to any cause except for a spike occurring within the period from the time t31 to the time t32 illustrated in FIG. 10A.

That is, during the drive signal Vi*# directing the on command so that the switching element S*# is ON, the measured value of the sense voltage Vse may be unstable due to, for example, noise and a gradual increase in the collector current flowing through the switching element S*#. In view of this point, the configuration of the drive unit DU according to this embodiment does not give the drive controller 22 any chance to use the measured value of the sense voltage Vse at the timing immediately before the drive signal Vi*# becoming the off command for comparison with the threshold voltage Vth2. In addition, the configuration of the drive unit DU according to this embodiment prevents noise from entering the measured value of the sense voltage Vse during the switching element S*# being ON.

Accordingly, the relationship between the measured level of the sense voltage Vse and the threshold voltage Vth2 is actually recognized. This results in an accurate recognition of a certain margin of voltage between the collector-emitter voltage Vse and an acceptable upper limit therefor as a function of the accurately recognized relationship between the measured level of the sense voltage Vse and the threshold voltage Vth2.

Fourth Embodiment

A control system for controlling the motor-generator 10 according to a fourth embodiment of the present disclosure will be described with reference to FIGS. 11A and 11B.

The structure and/or functions of the control system according to the fourth embodiment are mainly identical to those of the control system according to the first embodiment except for the following points. So, the different points mainly will be described hereinafter.

The charging and discharging routine for each switching element S*# according to the fourth embodiment is configured to validate the measured level of the sense voltage Vse to be used for comparison with the threshold voltage Vth2 as long as:

the drive signal Vi*# directs the on command;

it is determined that the measured level of the sense voltage Vse is equal to or higher than the threshold voltage Vth2 at a timing as a reference timing; and a preset second threshold time TB has elapsed since the reference timing while the measured level of the sense voltage Vse is kept to be equal to or higher than the threshold voltage Vth2.

FIG. 11A schematically illustrates the specific operations of the variables correlated with the charging and discharging routine while the active gate control is not used according to this embodiment. (a) to (e) of FIG. 11A correspond to (a) to (d), and (g) of FIG. 6. Note that, in FIG. 11A, the illustration of how the rate of discharging the gate of the switching element S*# varies and that of how the sense voltage Vse to be used for comparison with the threshold voltage Vth1 varies as "valid" or "invalid" are omitted because they are identical to those in (e) and (f) of FIG. 6.

When a drive signal Vi*# inputted to the drive unit DU is changed from the off command to the on command at time t41, the charging task for the gate of the switching element S*# is started at the time t41 so that the gate of the switching element S*# starts to rise (see steps S6 and S8).

Figure 11B:
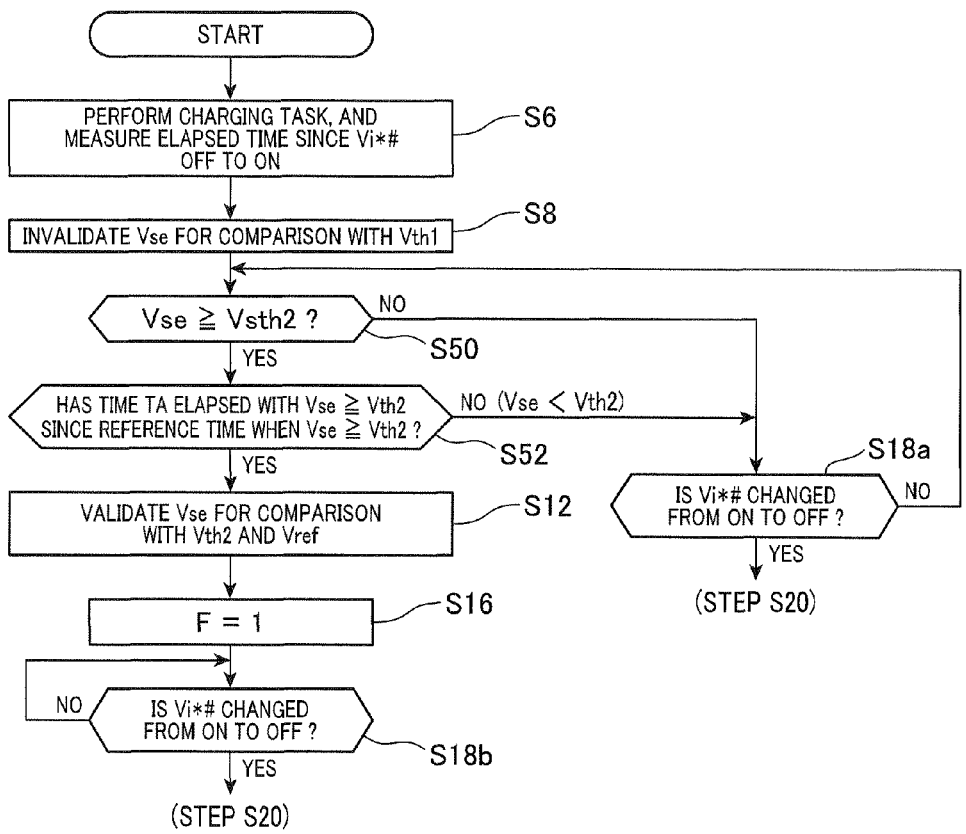
FIG. 11B is a flowchart schematically illustrating an example of a part of the charging and discharging routine according to the fourth embodiment.

Thereafter, the drive controller 22 determines whether the measured level of the sense voltage Vse becomes equal to or higher than the threshold voltage Vth2 in step S50 of FIG. 11B.

Upon determination that the measured level of the sense voltage Vse is lower than the threshold voltage Vth2 (NO in step S50), the drive controller 22 determines whether the drive signal Vi*# is changed from the on command to the off command in step S18a. Upon determination that the drive signal Vi*# is not changed from the on command to the off command (NO in step S18a), the drive controller 22 repeats the operation in step S50. As a result, upon determination that the drive signal Vi*# is changed from the on command to the off command (YES in step S18), the routine proceeds to step S20 with the disabling flag F being kept to 0.

Otherwise, upon determination that the measured level of the sense voltage Vse becomes equal to or higher than the threshold voltage Vth2 at time t42 (YES in step S50), the drive controller 22 holds the time t42 as a reference timing, and carries out the operation in step S52.

Specifically, the drive controller 22 determines whether the preset second threshold time TB has elapsed since the reference timing t42 while the measured level of the sense voltage Vse is kept to be equal to or higher than the threshold voltage Vth2 in step S52.

Upon determination that the measured level of the sense voltage Vse becomes lower than the threshold voltage Vth2 until the second threshold time has elapsed since the reference timing t42 (NO in step S52), the drive controller 22 carries out the operation in step S18a.

Otherwise, upon determination that the preset second threshold time TB has elapsed at time t43 since the reference timing t42 while the measured level of the sense voltage Vse is kept to be equal to or higher than the threshold voltage Vth2 (YES in step S52), the drive controller 22 carries out the operation in step S12. In step S12, the drive controller 22 validates the measured level of the sense voltage Vse to be used for comparison with the reference voltage Vref, and sets the disabling flag F to 1 indicative of non-execution of the task of disabling the active gate control in step S16 (see the time t43).

Thereafter, the routine proceeds to step S20 in response to the time when the drive signal Vi*# is changed from the on command to the off command (see YES in step S18b).

In step S20, as described above, the drive controller 22 invalidates the measured level of the sense voltage Vse to be used for comparison with the threshold voltage Vth2, and validates the measured level of the sense voltage Vse to be used for comparison with the threshold voltage Vth1 (see time t44).

The operations in steps S50 and S52 by the drive controller 22 serve as, for example, the discharging control module.

Other operations of the variables correlated with the charging and discharging routine according to this embodiment are substantially identical to corresponding operations of the variables correlated with the charging and discharging routine according to the first embodiment.

Specifically, the drive unit DU for each switching element S*# according to this embodiment is configured to perform the task of disabling the active gate control when determining that a predetermined condition is met. The predetermined condition is that:

the drive signal Vi*# directs the on command;

it is determined that the measured level of the sense voltage Vse is equal to or higher than the threshold voltage Vth2 at a timing as the reference timing; and the preset second threshold time TB has elapsed since the reference timing while the measured level of the sense voltage Vse is kept to be equal to or higher than the threshold voltage Vth2.

This configuration enables the measured level of the sense voltage Vse to be used for determination of whether to perform the task of disabling the active gate control independently of a spike that may be produced due to the turn-on of the drive signal g*#. Thus, the configuration of each drive unit DU according to the second embodiment achieves the same effects as the configuration of each drive unit DU according to the first embodiment.

In addition, the configuration prevents the switching element S*# from driven erroneously even if noise temporarily enters the measured level of the sense voltage Vse within the period from the time t41 to the time t44. This is because, even if the measured level of the sense voltage Vse temporarily exceeded the threshold voltage Vth2 due to such temporary noise, the measured level of the sense voltage Vse could become lower than the threshold voltage Vth2 before the preset threshold time TB has elapsed since the corresponding reference timing.

More specifically, if the drive controller 22 used the measured level of the sense voltage Vse for comparison with the second threshold Vth2 without the lapse of the threshold time TB since the reference timing, the rate of discharging the gate of the switching element S*# might be determined erroneously, resulting in reduction of the effect of decreasing switching loss.

However, the configuration of the drive unit DU according to this embodiment prevents the rate of discharging the gate of the switching element S*# from being determined erroneously.

Fifth Embodiment

Figure 14:
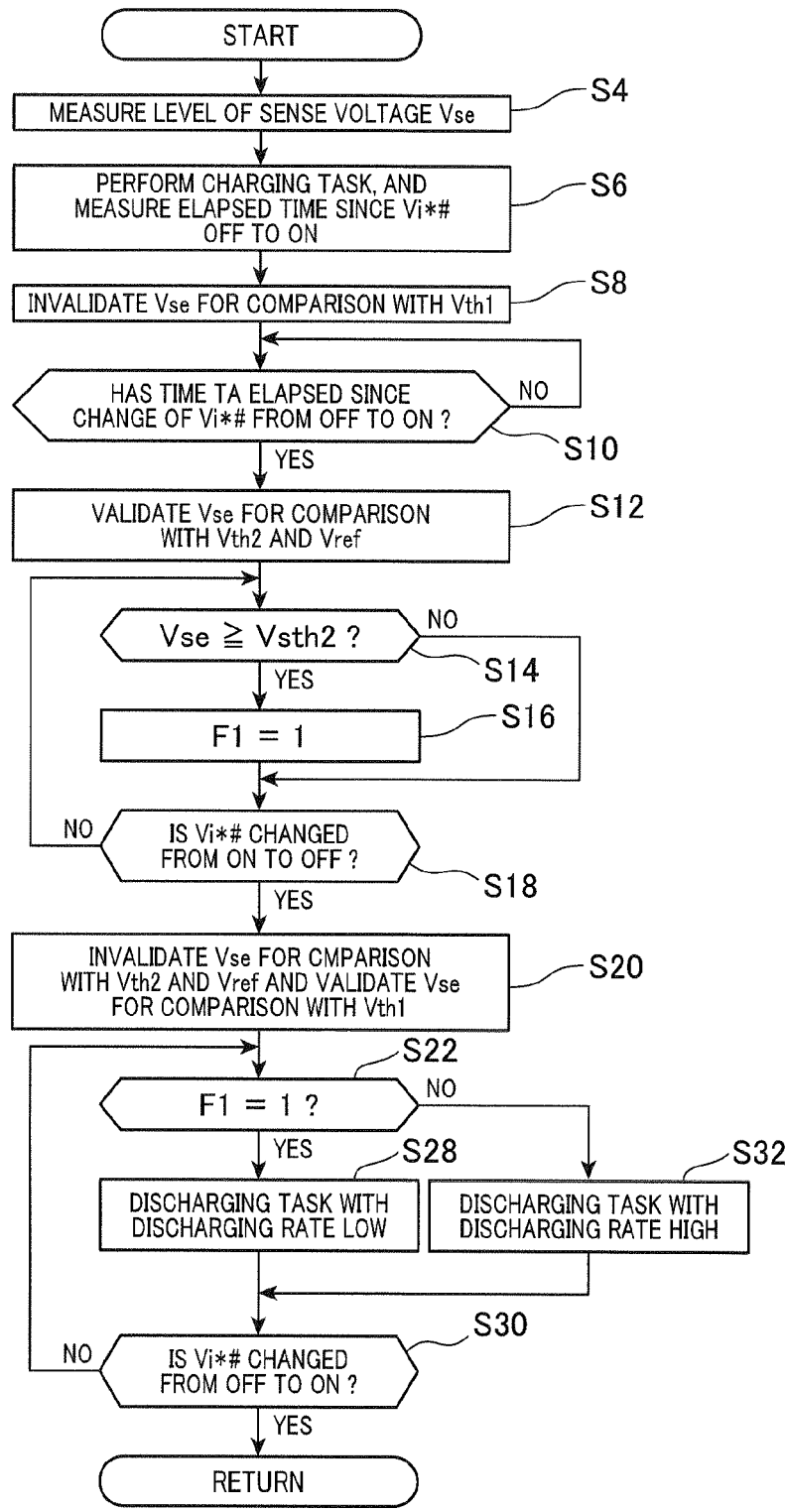
FIG. 14 is a flowchart schematically illustrating an example of the charging and discharging routine according to the fifth embodiment.

A control system for controlling the motor-generator 10 according to a fifth embodiment of the present disclosure will be described with reference to FIGS. 12, 13, and 14.

The structure and/or functions of the control system according to the fifth embodiment are mainly identical to those of the control system according to the first embodiment except for the following points. So, the different points mainly will be described hereinafter.

The charging and discharging routine for each switching element S*# according to the first embodiment is configured to change the rate of discharging the gate of the switching element S*# in the middle of the discharge period from the start of discharging the gate of the switching element S*# to the completion of the discharge from the gate of the switching element S*#.

In contrast, the charging and discharging routine for each switching element S*# according to the fifth embodiment is configured to set the rate of discharging the gate of the switching element S*# to one of a lower value and a higher value in the middle of the discharge period from the start of discharging the gate of the switching element S*# to the completion of the discharge from the gate of the switching element S*#.

In this embodiment, in place of the disabling flag F, a discharging-rate changing flag F1 is used. The discharging-rate changing flag F1 being set to 1 enables the drive controller 22 to set the rate of discharging the gate of the switching element S*# to the lower value. The discharging-rate changing flag F of 0 enables the drive controller 22 to set the rate of discharging the gate of the switching element S*# to the higher value.

FIG. 12 schematically illustrates specific operations of the variables correlating with the charging and discharging routine when the rate of discharging the gate of the switching element S*# is set to the lower value according to this embodiment. (a) to (f) of FIG. 12 correspond to (a) to (e), and (g) of FIG. 6. Note that, in FIG. 12, the illustration of how the sense voltage Vse to be used for comparison with the reference voltage Vref varies as "valid" or "invalid" is omitted because it is identical to those in (h) of FIG. 6.

When a drive signal Vi*# inputted to the drive unit DU is changed from the off command to the on command at time t51, the charging task for the gate of the switching element S*# is started at the time t51. This charging task results in the gate of the switching element S*# starting to rise (see steps S6 and S8 of FIG. 14).

After the start of the increase in the gate voltage Vge, the measured level of the sense voltage Vse to be used for comparison with the threshold voltage Vth2 is validated at time t52 when the first threshold time TA has elapsed since the change of the drive signal Vi*# from the off command to the on command (see step S12). Thereafter, when it is determined that the measured level of the sense voltage Vse is equal to or higher than the threshold voltage Vth2 at time t53 within the period during which the measured level of the sense voltage Vse to be used for comparison with the threshold voltage Vth2 is validated (see YES in step S14), the discharging-rate changing flag F1 is set to 1 (see step S16).

The discharging-rate changing flag F1 being set to 1 enables the drive controller 22 to set the rate of discharging the gate of the switching element S*# to the lower value.

Thereafter, when the drive signal Vi*# is changed from the on command to the off command at time t54 (see YES in step S18), the measured level of the sense voltage Vse to be used for comparison with the threshold voltage Vth2 is invalidated, and the measured level of the sense voltage Vse to be used for comparison with the threshold voltage Vth1 is validated (see step S20).

At that time, because the discharging-rate changing flag F1 is 1 so that the determination in step S22 is YES, the discharging task is carried out while the rate of discharging the gate of the switching element S*# is set to the lower value in step S28. Specifically, the gate of the switching element S*# is discharged via one of the first and second positive-charge dissipating paths. This sets the rate of discharging the gate of the switching element S*# to the lower value (see step S28 and the period from the time t54 to time t55 in FIG. 12).

This discharging task gives a priority to the effect of decreasing a surge in comparison to the effect of reducing switching loss.

FIG. 13 schematically illustrates specific operations of the variables correlating with the charging and discharging routine when the rate of discharging the gate of the switching element S*# is set to the higher value according to this embodiment. (a) to (f) of FIG. 13 correspond to (a) to (f) of FIG. 6. Note that, in FIG. 12, the illustration of How the sense voltage Vse to be used for comparison with the reference voltage Vref varies as "valid" or "invalid" is omitted because it is identical to those in (h) of FIG. 6.

When a drive signal Vi*# inputted to the drive unit DU is changed from the off command to the on command at time t61, the charging task for the gate of the switching element S*# is started at the time t61. This charging task results in the gate of the switching element S*# starting to rise (see steps S6 and S8 of FIG. 14).

After the start of the increase in the gate voltage Vge, the measured level of the sense voltage Vse to be used for comparison with the threshold voltage Vth2 is validated at time t62 when the first threshold time TA has elapsed since the change of the drive signal Vi*# from the off command to the on command (see step S12). Thereafter, when it is determined that the measured level of the sense voltage Vse is kept to be lower than the threshold voltage Vth2 within the period during which the measured level of the sense voltage Vse to be used for comparison with the threshold voltage Vth2 is validated (see NO in step S14), the discharging-rate changing flag F1 is kept to 0 (see the skip of the operation in step S16).

The discharging-rate changing flag F1 being set to 0 enables the drive controller 22 to set the rate of discharging the gate of the switching element S*# to the higher value.

Thereafter, when the drive signal Vi*# is changed from the on command to the off command at time t63 (see YES in step S18), the measured level of the sense voltage Vse to be used for comparison with the threshold voltage Vth2 is invalidated, and the measured level of the sense voltage Vse to be used for comparison with the threshold voltage Vth1 is validated (see step S20).

At that time, because the discharging-rate changing flag F1 is 0 so that the determination in step S22 is NO, the discharging task is carried out while the rate of discharging the gate of the switching element S*# is set to the higher value in step S32. Specifically, the gate of the switching element S*# is discharged via both the first and second positive-charge dissipating paths. This sets the rate of discharging the gate of the switching element S*# to the higher value (see step S32 and the period from the time t63 to time t64 in FIG. 13).

This discharging task gives a priority to the effect of reducing switching loss in comparison to the effect of decreasing a surge.

As described above, the drive unit DU for each switching element S*# according to this embodiment is configured to perform the discharging task while balancing the effect of decreasing a surge and the effect of reducing switching loss.

The drive units DU and the control system according to each of the first to fifth embodiments can be modified.

In each of the first to fourth embodiments, the sense voltage Vse is used as a parameter used to determine whether to perform the task of disabling the active gate control, but the present disclosure is not limited thereto.

Specifically, a parameter as a function of the level of the sense voltage Vse, such as an output current flowing out of the sense terminal St of the switching element S*# can be used. In this modification, a detector 60 for detecting the output current from the sense terminal St, which correlates with the collector current flowing through the conductive path of the switching element S*# can be used.

As such a parameter, in addition to a parameter correlating with the collector current, the collector current itself can be used. For example, the detector 60 can be configured to directly detect the collector current. FIG. 2 schematically illustrates the detector 60, such as a hall element, configured to directly detect the collector current. The detector 60 can be eliminated from the control system 100 according to the first embodiment. In this modification, as illustrated in, for example, FIG. 4, the collector current may be unstable within the period during which the switching element S*# is changed from OFF to ON. For this reason, as described in the first embodiment, a level of the collector current detected by the detector 60 after the first threshold time TA has elapsed since the change of the drive signal Vi*# from the off command to the on command is preferably used to determine whether to perform the task of disabling the active gate control. The using of the level of the collector current after the lapse of the first threshold time TA makes it possible to determine whether there is a need to perform the task of disabling the active gate control with high accuracy.

Similarly, in the fifth embodiment, the output current flowing out of the sense terminal St of the switching element S*# or the collector current can be used to determine whether the rate of discharging the gate of the switching element S*# is changed between the lower level and the higher level.

In each of the first to fifth embodiments, the drive IC 20, more particularly, the drive controller 22 is configured to perform the charging and discharging routine, but another component, such as the control unit 14, can be configured to perform the charging and discharging routine. In this modification, for example, in each of the operations in steps S10, S18, and S30 illustrated in FIG. 5, the drive signal g*# can be used in place of the drive signal Vi*#. In other words, a driver according to the present disclosure can be designed as a drive unit DU for a switching element S*#, the combination of the drive unit DU and another component configured to perform the charging and discharging routine.

In the first embodiment, the drive controller 22 changes the rate of discharging the gate of the switching element S*# from the higher value to the lower value at the time t2A in FIG. 3 corresponding to the time t7 in FIG. 6 at which the measured level of the sense voltage Vse reaches the threshold voltage Vth1, but the present disclosure is not limited thereto. Specifically, the drive controller 22 can change the rate of discharging the gate of the switching element S*# from the higher value to the lower value at a time earlier than the time t2A at which the measured level of the sense voltage Vse reaches the threshold voltage Vth1 as long as the time earlier than the time t2A is within the period during which the drive signal Vi*# is the off command. Note that the earlier the time to change the rate of discharging the gate of the switching element S*# from the higher value to the lower value is, the lower the switching speed of the switching element S*# is.

In each of the first to fifth embodiments, the drive controller 22 changes the rate of discharging the gate of the switching element S*# using two different values, but the present disclosure can change the rate of discharging the gate of the switching element S*# using three or more values. For example, the drive controller 22 can change the rate of discharging the gate of the switching element S*# in three values. That is, the drive controller 22 can change the discharge path of the gate of the switching element S*# among: the first positive-charge dissipating path including the resistor 34a; the second positive-charge dissipating path including the resistor 34b different in resistance than the resistor 34a; and the high-resistance discharge path including the soft-turnoff switching element 44.

In the first embodiment, the drive controller 22 disables the measured level of the sense voltage Vse to be used for comparison with the reference voltage Vref within the first period until the first threshold time TA has elapsed since the change of the drive signal Vi*# from the off command to the on command, but the present disclosure is not limited thereto. Specifically, the drive controller 22 can disable the measured level of the sense voltage Vse to be used for comparison with the reference voltage Vref within a period until the measured level of the sense voltage Vse reaches the preset voltage level Va.

In the fifth embodiment, the drive controller 22 uses the approach disclosed in the first embodiment to disable the measured level of the sense voltage Vse to be used for comparison with the threshold voltage Vth2, but the present disclosure is not limited thereto. Specifically, the drive controller 22 can use one of the approaches disclosed in the respective second to fourth embodiments to disable the measured level of the sense voltage Vse to be used for comparison with the threshold voltage Vth2.

In each of the first to fifth embodiments, an IGBT is used as a switching element S*# of each drive unit DU, but an N-channel MOSFET or a P-channel MOSFET can be used as a switching element S*# of each drive unit DU. If a P-channel MOSFET is used as a switching element S*# of each drive unit DU, because a potential difference from the on-off control terminal, i.e. the gate, of the P-channel MOSFET to one end, i.e. the source, thereof is set to be a negative value turns the P-channel MOSFET to on state. Thus, in this case, the drive controller 22 stores a positive charge on the gate of the P-channel MOSFET, i.e. the switching element S*#, to turn off the P-channel MOSFET.

In each of the first to fifth embodiments, a switching element S*# to which a drive unit DU according to a corresponding one of these embodiments is provided is installed in each of the inverter INV and the converter CNV. However, in the present disclosure, a switching element S*# to which a drive unit DU according to a corresponding one of these embodiments is provided can be installed in another device. A power converter, such as an inverter and a converter, in which a switching element S*# to which a drive unit DU according to a corresponding one of these embodiments is provided is installed is installed in a motor vehicle, but can be installed in another machine.

While illustrative embodiments of the present disclosure have been described herein, the present disclosure is not limited to the embodiments described herein, but includes any and all embodiments having modifications, omissions, combinations (e.g., of aspects across various embodiments), adaptations and/or alternations as would be appreciated by those in the art based on the present disclosure. The limitations in the claims are to be interpreted broadly based on the language employed in the claims and not limited to examples described in the present specification or during the prosecution of the application, which examples are to be construed as non-exclusive.

What is claimed is:

1. A driver for selectively performing a charging task and a discharging task for an on-off control terminal of a voltage-controlled switch having a conductive path, according to a drive signal directing selectively an on state and an off state of the voltage-controlled switch, thus setting the voltage-controlled switch to one of the on state and the off state, the driver comprising:
a discharging-rate changing module adapted to change a rate of discharging the on-off control terminal of the voltage-controlled switch at least between a first value and a second value lower than the first value;
a measuring module configured to measure a value of a parameter as a function of a current flowing through the conductive path of the voltage-controlled switch during the drive signal being in the on state; and
a discharging control module configured to:
control the discharging-rate changing module, as a function of the value of the parameter, to select one of the first value and the second value as the rate of discharging the on-off control terminal of the voltage-controlled switch upon the drive signal directing a change from the on state of the voltage-controlled switch to the off state thereof; and
discharge the on-off control terminal of the voltage-controlled switch using the selected one of the first value and the second value as the rate of discharging the on-off control terminal of the voltage-controlled switch.

2. The driver according to claim 1, wherein the discharging control module is configured to:
if the value of the parameter measured by the measuring module, after the voltage-controlled switch is in the on state, is lower than a first threshold value, control the discharging-rate changing module to select the first value as the rate of discharging the on-off control terminal of the voltage-controlled switch within at least a period during which the value of the parameter measured by the measuring module is rising while the drive signal is directing the voltage-controlled switch to be in the off state.

3. The driver according to claim 1, wherein the discharging control module is configured to:
if the value of the parameter measured by the measuring module, after the voltage-controlled switch is in the on state, is equal to or higher than a first threshold value,
control the discharging-rate changing module to change the rate of discharging the on-off control terminal of the voltage-controlled switch from the first value to the second value within a period during which the value of the parameter is rising while the drive signal is directing the voltage-controlled switch to be in the off state; and
if the value of the parameter measured by the measuring module, after the voltage-controlled switch is in the on state, is lower than the first threshold value,
control the discharging-rate changing module to select the first value as the rate of discharging the on-off control terminal of the voltage-controlled switch within a period during which the drive signal is directing the voltage-controlled switch to be in the off state.

4. The driver according to claim 3, wherein:
the voltage-controlled switch includes:
a pair of high- and low-side switching elements connected in series and connected to positive and negative terminals of a DC power source, each of the high- and low-side switching elements having a sense terminal from which a current correlating with the current flowing through the conductive path is outputted; and
a pair of flywheel diodes, each of which is connected in antiparallel to a respective one of the high- and low-side switching elements,
the measuring module is configured to measure the value of the parameter as a function of the current outputted from the sense terminal of each of the high- and low-side switching elements, and
the discharging control module is configured to:
determine a timing at which the value of the parameter measured by the measuring module becomes equal to or higher than a second threshold value as a timing to change the rate of discharging the on-off control terminal of each of the high- and low-side switching elements from the first value to the second value, the first threshold value being lower than the second threshold value; and
validate the value of the parameter measured by the measuring module to be used for determining the timing to change the rate of discharging the on-off control terminal of each of the high- and low-side switching elements within only a period during which the drive signal is directing the voltage-controlled switch to be in the off state.

5. The driver according to claim 1, wherein the discharging control module is configured to:
if the value of the parameter measured by the measuring module, after the voltage-controlled switch is in the on state, is lower than a first threshold value,
control the discharging-rate changing module to select the first value as the rate of discharging the on-off control terminal of the voltage-controlled switch within a period during which the drive signal is directing the voltage-controlled switch to be in the off state; and
if the value of the parameter measured by the measuring module, after the voltage-controlled switch is in the on state, is equal to or higher than the first threshold value,
control the discharging-rate changing module to select the second value as the rate of discharging the on-off control terminal of the voltage-controlled switch within a period during which the drive signal is directing the voltage-controlled switch to be in the off state.

6. The driver according to claim 1, wherein the discharging control module is configured to:
  compare the value of the parameter measured by the measuring module with a first threshold value to determine whether the value of the parameter is lower than the first threshold value; and
  if a preset time has elapsed since a timing at which the drive signal directing the voltage-controlled switch to be in the on state occurs,
  validate the value of the parameter measured by the measuring module to be used for the comparison with the first threshold value within a period during which the drive signal is directing the voltage-controlled switch to be in the on state.

7. The driver according to claim 2, wherein the discharging control module is configured to:
  compare the value of the parameter measured by the measuring module with the first threshold value to determine whether the value of the parameter is lower than the first threshold value; and
  if a preset time has elapsed since a timing at which the drive signal directing the voltage-controlled switch to be in the on state occurs,
  validate the value of the parameter measured by the measuring module to be used for the comparison with the first threshold value within a period during which the drive signal is directing the voltage-controlled switch to be in the on state.

8. The driver according to claim 1, wherein the discharging control module is configured to:
  compare the value of the parameter measured by the measuring module with a first threshold value to determine whether the value of the parameter is lower than the first threshold value; and
  if a voltage at the on-off control terminal of the voltage-controlled switch is equal to or higher than a threshold voltage; and
  the voltage-controlled switch has been completely changed to be in the on state,
  validate the value of the parameter measured by the measuring module to be used for the comparison with the first threshold value.

9. The driver according to claim 2, wherein the discharging control module is configured to:
  compare the value of the parameter measured by the measuring module with the first threshold value to determine whether the value of the parameter is lower than the first threshold value; and
  if a voltage at the on-off control terminal of the voltage-controlled switch is equal to or higher than a threshold voltage; and
  the voltage-controlled switch has been completely changed to be in the on state,
  validate the value of the parameter measured by the measuring module to be used for the comparison with the first threshold value.

10. The driver according to claim 1, wherein the discharging control module is configured to:
  compare the value of the parameter measured by the measuring module with a first threshold value to determine whether the value of the parameter is lower than the first threshold value; and
  upon the drive signal directing a change from the on state of the voltage-controlled switch to the off state thereof, validate the value of the parameter measured by the measuring module to be used for the comparison with the first threshold value.

11. The driver according to claim 2, wherein the discharging control module is configured to:
  compare the value of the parameter measured by the measuring module with the first threshold value to determine whether the value of the parameter is lower than the first threshold value; and
  upon the drive signal drive signal directing a change from the on state of the voltage-controlled switch to the off state thereof, validate the value of the parameter measured by the measuring module to be used for the comparison with the first threshold value.

12. The driver according to claim 1, wherein the discharging control module is configured to:
  compare the value of the parameter measured by the measuring module with a first threshold value to determine whether the value of the parameter is lower than the first threshold value; and
  if a preset reference time has elapsed since a timing at which the value of the parameter measured by the measuring module became equal to or higher than the first threshold value,
  validate the value of the parameter measured by the measuring module to be used for the comparison with the first threshold value.

13. The driver according to claim 2, wherein the discharging control module is configured to:
  compare the value of the parameter measured by the measuring module with the first threshold value to determine whether the value of the parameter is lower than the first threshold value; and
  if a preset reference time has elapsed since a timing at which the value of the parameter measured by the measuring module became equal to or higher than the first threshold value,
  validate the value of the parameter measured by the measuring module to be used for the comparison with the first threshold value.

14. The driver according to claim 6, wherein the voltage-controlled switch includes:
  a pair of high- and low-side switching elements connected in series and connected to positive and negative terminals of a DC power source, each of the high- and low-side switching elements having a sense terminal from which a current correlating with the current flowing through the conductive path is outputted; and
  a pair of flywheel diodes, each of which is connected in antiparallel to a respective one of the high- and low-side switching elements, and
  the measuring module is configured to measure the value of the parameter as a function of the current outputted from the sense terminal of each of the high- and low-side switching elements.

15. The driver according to claim 7, wherein the voltage-controlled switch includes:
  a pair of high- and low-side switching elements connected in series and connected to positive and negative terminals of a DC power source, each of the high- and low-side switching elements having a sense terminal from which a current correlating with the current flowing through the conductive path is outputted; and
  a pair of flywheel diodes, each of which is connected in antiparallel to a respective one of the high- and low-side switching elements, and
  the measuring module is configured to measure the value of the parameter as a function of the current outputted from the sense terminal of each of the high- and low-side switching elements.

16. The driver according to claim 14, further comprising:

a turnoff module configured to discharge the on-off control terminal of each of the high- and low-side switching elements using a third value as the rate of discharging the on-off control terminal of a corresponding one of the high- and low-side switching elements upon the value of the parameter measured by the measuring module being equal to or higher than a reference value, the third value being lower than the second value; and a disabling module configured to disable the turnoff module from discharging the on-off control terminal of each of the high- and low-side switching elements within at least one of:

a first period until a reference time has elapsed since a timing at which the drive signal directed a change to the on state of the voltage-controlled switch; and a second period during which the drive signal is directing the voltage-controlled switch to be in the off state.

17. The driver according to claim 15, further comprising:

a turnoff module configured to discharge the on-off control terminal of each of the high- and low-side switching elements using a third value as the rate of discharging the on-off control terminal of a corresponding one of the high- and low-side switching elements upon the value of the parameter measured by the measuring module being equal to or higher than a reference value, the third value being lower than the second value; and a disabling module configured to disable the turnoff module from discharging the on-off control terminal of each of the high- and low-side switching elements within at least one of:

a first period until a reference time has elapsed since a timing at which the drive signal directed a change to the on state of the voltage-controlled switch; and a second period during which the drive signal is directing the voltage-controlled switch to be in the off state.

18. A control system for controlling a rotary machine, the control system comprising:

a converter equipped with at least one pair of first voltage-controlled switching elements connected in series, each of the first voltage-controlled switching elements having a conductive path and an on-off control terminal; and an inverter equipped with at least one pair of second voltage-controlled switching elements connected in series, each of the second voltage-controlled switching elements having a conductive path and an on-off control terminal; and a driver for selectively performing a charging task and a discharging task for the on-off control terminal of each of the voltage-controlled switching elements, according to a drive signal directing selectively an on state and an off state of the voltage-controlled switch to thereby boost a DC voltage inputted to the converter, and invert the boosted DC voltage into an AC voltage to be supplied to the rotary machine, the driver for each of the first and second voltage-controlled switching elements comprising:

a discharging-rate changing module adapted to change a rate of discharging the on-off control terminal of a corresponding one of the first and second voltage-controlled switching elements at least between a first value and a second value lower than the first value;

a measuring module configured to measure a value of a parameter as a function of a current flowing through the conductive path of a corresponding one of the first and second voltage-controlled switching elements during the drive signal being in the on state; and a discharging control module configured to:

control the discharging-rate changing module, as a function of the value of the parameter, to select one of the first value and the second value as the rate of discharging the on-off control terminal of a corresponding one of the first and second voltage-controlled switching elements upon the drive signal directing a change from the on state of a corresponding one of the first and second voltage-controlled switching elements to the off state thereof; and discharge the on-off control terminal of a corresponding one of the first and second voltage-controlled switching elements using the selected one of the first value and the second value as the rate of discharging the on-off control terminal thereof.

* * * * *